(12) United States Patent
Miura et al.

(10) Patent No.: US 8,659,248 B2
(45) Date of Patent: Feb. 25, 2014

(54) DRIVE DEVICE FOR ELECTRIC POWER CONVERSION CIRCUIT

(75) Inventors: Ryotaro Miura, Nukata-gun (JP); Tsuneo Maebara, Nagoya (JP); Yusuke Shindo, Nagoya (JP); Junichi Fukuta, Anjo (JP); Junichi Nagata, Okazaki (JP)

(73) Assignee: Denso Corporation, Kariya (JP)

( * ) Notice: Subject to any disclaimer, the term of this patent is extended or adjusted under 35 U.S.C. 154(b) by 565 days.

(21) Appl. No.: 12/971,526

(22) Filed: Dec. 17, 2010

(65) Prior Publication Data

US 2011/0163706 A1 Jul. 7, 2011

(30) Foreign Application Priority Data

Dec. 18, 2009 (JP) ................................. 2009-287325
Dec. 18, 2009 (JP) ................................. 2009-287326

(51) Int. Cl.
*H02P 6/14* (2006.01)
*H02P 6/00* (2006.01)
*H02P 25/00* (2006.01)
*H02P 27/04* (2006.01)

(52) U.S. Cl.
USPC ............... 318/400.27; 318/400.01; 318/727; 318/800; 318/801

(58) Field of Classification Search
USPC ............ 318/400.27, 400.01, 727, 800, 801
See application file for complete search history.

(56) References Cited

U.S. PATENT DOCUMENTS 5,210,479 A * 5/1993 Kimura et al. ............... 318/727
6,573,681 B2 * 6/2003 Schwesig ..................... 318/801
7,012,401 B2 * 3/2006 Ohkouchi et al. ............ 318/801
7,471,055 B2 * 12/2008 Atmur ..................... 318/400.01
2003/0151383 A1 8/2003 Hayashi (Continued)

FOREIGN PATENT DOCUMENTS

JP 2000-050692 2/2000
JP 2001-112295 4/2001

(Continued)

OTHER PUBLICATIONS

Japanese Office Action dated Oct. 25, 2011, issued in corresponding Japanese Application No. 2009-287325, with English translation.

(Continued)

*Primary Examiner* — Eduardo Colon Santana
*Assistant Examiner* — Gabriel Agared
(74) *Attorney, Agent, or Firm* — Nixon & Vanderhye PC

(57) ABSTRACT

A drive device has a break circuit. The break circuit inputs phase-current values transferred from phase-current sensors mounted on an electrical path of a motor generator. A power switching element is equipped with a freewheel diode connected in parallel with each other. An inverter has pairs of the power switching elements. In each pair, the power switching element in a high voltage side and the power switching element in a low voltage side are connected in series. It is detected for the freewheel diode to be in a freewheel mode when a forward current flows in the freewheel diode. The break circuit detects the freewheel mode where the current flows in the freewheel diode in a lower arm when the phase-current value is not less than a predetermined threshold value. The break circuit detects the freewheel mode where the current flows in the freewheel diode in an upper arm when the phase-current value is not more than the threshold current value.

17 Claims, 13 Drawing Sheets

(56) References Cited

U.S. PATENT DOCUMENTS

| | | | |
|---|---|---|---|
| 2004/0222767 A1 | 11/2004 | Ohkouchi et al. | |
| 2006/0038523 A1* | 2/2006 | Fujino et al. | 318/600 |
| 2007/0273323 A1* | 11/2007 | Acquaviva et al. | 318/720 |
| 2007/0285046 A1* | 12/2007 | Yamaguchi et al. | 318/800 |
| 2010/0263644 A1* | 10/2010 | Matsuda et al. | 123/625 |

FOREIGN PATENT DOCUMENTS

| | | |
|---|---|---|
| JP | P2002-325498 A | 11/2002 |
| JP | 2003-235285 | 8/2003 |
| JP | P2004-336907 A | 11/2004 |
| JP | P2005-278398 A | 10/2005 |
| JP | P2006-54943 A | 2/2006 |
| JP | 2006-345683 | 12/2006 |
| JP | 2008-072848 | 3/2008 |

OTHER PUBLICATIONS

Japanese Office Action dated Oct. 25, 2011, issued in corresponding Japanese Application No. 2009-287326, with English translation.

* cited by examiner

DRIVE DEVICE FOR ELECTRIC POWER CONVERSION CIRCUIT

CROSS-REFERENCE TO RELATED APPLICATION

This application is related to and claims priority from Japanese Patent Applications, No. 2009-287325 filed on Dec. 18, 2009 and No. 2009-287326 filed on Dec. 18, 2009, the contents of which are hereby incorporated by reference.

BACKGROUND OF THE INVENTION

1. Field of the Invention

The present invention relates to drive devices for controlling the operation of an electric power conversion circuit (or an inverter) connected to an electric rotary machine such as a motor generator.

2. Description of the Related Art

Electric power conversion circuits (or inverters) are well known. In general, such an electric conversion circuit is arranged between a direct current power source and an electric rotary machine. The electric power conversion circuit connects terminals of the direct current power source with terminals of the electric rotary machine. In general, the electric power conversion circuit is comprised of switching elements in a high voltage side and switching elements in a low voltage side. For example, power switching elements such as insulation gate bipolar transistor (IGBT) are used as these switching elements. The electric power conversion circuit is composed of some pairs of these switching elements. Each pair is composed of the switching element in the high voltage side and the switching element in the low voltage side connected in series.

Each of the switching elements in at least one of the high voltage side and the low voltage side in the electric power conversion circuit is equipped with a freewheel diode. In particular, the switching element and the corresponding freewheel diode are connected in parallel.

In order to generate and then flow a current having a sine-curved waveform in an electric rotary machine, it is necessary to drive the switching elements in the high voltage side and the switching elements in the low voltage side so that the switching elements in the high voltage side and the switching elements in the low voltage side are alternately driven. This makes it possible to drive the pairs of the switching elements in the high voltage side and the switching elements in the low voltage side in a complementary manner.

On the other hand, in general, each of the switching elements used in the above electric power conversion circuit, namely, the inverter is made of an insulation gate bipolar transistor (IGBT). Recent trend uses an IGBT with a freewheel diode. In particular, the IGBT and the freewheel diode are connected in parallel on the same semiconductor substrate.

Because a current flowing from the collector to the emitter is a forward current in the IGBT, no reversed current of the forward current flows in the IGBT. However, when the pairs of the switching elements in the inverter are driven in a complementary manner, there is a possibility of no current flowing in the switching element which is turned on according to a direction of the current of a sine curved waveform. This case further causes for the freewheel diode connected in parallel to the switching element to enter a freewheel mode. In the freewheel mode, a current flows in the freewheel diode where the switching element and the freewheel diode are reversely connected in parallel with each other.

It is known that the amount of a voltage drop in the above power switching element, namely, the IGBT with the freewheel diode is increased by supplying a voltage to the gate terminal of the IGBT when a forward current flows in the freewheel diode. This increases the electrical power loss generated in the freewheel diode, and further increases the entire electrical power loss of the IGBT with the freewheel diode.

In order to avoid such a conventional problem, Japanese patent laid open publication No. JP 2008-72848 has disclosed a conventional technique in which a control device forcedly turns off the freewheel diode when a current flowing in the freewheel diode is detected even if receiving an instruction signal to turn on a pair of IGBTs with a freewheel diode in a complementary manner. Specifically, small-sized electrodes are formed on the same semiconductor substrate on which the freewheel diode built-in the IGBT is formed, and the control device detects a small current through the small-sized electrodes. For example, such a small current is within a range of one-several thousandth to one ten-thousandth of a current actually flowing in the freewheel diode. When detecting the small current flowing through the freewheel diode through the small-sized electrodes, the control device forcedly turns off the switching element such as an IGBT. This can suppress the electrical power loss of the IGBT with the freewheel diode from increasing.

However, it is in general difficult to increase the detection accuracy to detect an actual current flowing in the freewheel diode on the basis of such a small current detected through the small-sized electrodes because such a small current value is very small. In other words, it is difficult to detect the current value with high accuracy and to turn off the switching element such as the IGBT equipped with the freewheel diode on the basis of the detection result of a small current through the small-sized electrodes unless a large current flows in the freewheel diode.

A control system using other types of switching elements with a built-in freewheel diode, other than such IGBT with a built-in freewheel diode, also have the same difficulty to timely inhibit the turning-on operation of the switching element when the freewheel diode is in the freewheel mode where a forward current flows in the freewheel diode.

SUMMARY OF THE INVENTION

It is an object of the present invention to provide a drive device capable of correctly and timely inhibiting a power switching element from being turned on when a freewheel diode connected in parallel to this power switching element is in a freewheel mode where a forward current flows in the freewheel diode. This can decrease an electric power loss generated in the power switching element in an electric power conversion circuit such as an inverter. For example, the electric power conversion circuit is arranged between a direct power source and an electric rotary machine such as a motor generator.

For example, the switching elements such as power switching elements (IGBT) in a high voltage side are connected to positive electrodes in three phases (U phase, V phase, and W phase) of a three-phase electric rotary machine. The switching elements such as power switching elements (IGBT) in a low voltage side are connected to negative electrodes in three phases of the three-phase electric rotary machine. The switching elements in a high voltage side and the switching elements in a low voltage side form an electric power conversion circuit such as an inverter.

To achieve the above purposes, the present invention provides a drive device which controls an operation of an electric power conversion circuit equipped with a plurality of pairs of switching elements. Each of the pairs is comprised of a switching element in a high voltage side and a switching element in a low voltage side. In particular, the switching element in a high voltage side and the switching element in a low voltage side are connected in series.

It can be possible for at least of one of the switching elements in the pair to be equipped with a freewheel diode. The switching element and the freewheel diode built-in the switching element are connected in parallel with each other. A connection node between the switching element in a high voltage side and the switching element in a low voltage side in each pair is connected to an inductor of an electric rotary machine such as a motor generator. The drive device has a freewheel mode detection means and an inhibition means. The freewheel mode detection means detects whether or not the freewheel diode is in a freewheel mode in which a current flows in the freewheel diode. The inhibition means receives a detection signal regarding current information transferred from a current detection means. The current detection means detects a current flowing in an electric path at the inductor side rather than the connection node between the switching element in a high voltage side and the switching element in a low voltage side in each pair. The inhibition means further detects whether or not the freewheel diode is in the freewheel mode on the basis of the received detection signal regarding the current information.

The inhibition means in the drive device according to the present invention inhibits the turning-on operation of the switching element equipped with the freewheel diode when detecting that the freewheel diode is in the freewheel mode where a current flows in the freewheel diode.

In general, a detection delay on detecting the freewheel mode of the freewheel diode is generated when the current detection means detects a current flowing in a detection point on an electrical path. This detection point is positioned toward the inductor side away from the connection node between the switching element in a high voltage side and the switching element in a low voltage side. Therefore this detection method has a possibility to cause a long delay time which is longer than a delay caused by a method of detecting the freewheel mode by using a small current flowing in small-sized electrodes. These small-sized electrodes are formed on the same semiconductor substrate on which the freewheel diode is formed.

The inventors of the present invention provide the drive device according to the present invention on the basis of the following reason.

On detecting the freewheel mode of the freewheel diode, the detection accuracy of a conventional technique which detects a small current through the small-sized electrodes is lower than the detection accuracy of the drive device according to the present invention which detects a current flowing in a detection point on an electrical path not using such small-sized electrodes. The detection point is positioned toward the inductor side away from the connection node between the switching element in a high voltage side and the switching element in a low voltage side.

Accordingly, on correctly performing the control process to inhibit the instruction to turn on the switching element, it is better to use the detection method performed by the drive device according to the present invention rather than the conventional detection method using a small current detected through the small-sized electrodes.

In the drive device as another aspect of the present invention, at least one of the switching element in a high voltage side and the switching element in a low voltage side in each pair and the freewheel diode connected in parallel to the switching element is formed on the same semiconductor substrate.

In general, the freewheel diode has a large conductive power loss when the switching element is turned on when compared with the conductive power loss when the switching element is turned off. The inhibition means can effectively decrease the conductive power loss, namely, electric power loss of the electric power conversion circuit such as an inverter.

In the drive device as another aspect of the present invention, the freewheel mode detection means detects whether the freewheel diode is in the freewheel mode on the basis of a comparison result between the current information transferred from the current detection means and a threshold current value. This threshold current value is a value which is shifted from zero toward a value by which a forward current can flow in the freewheel diode as the target to detect the occurrence of the freewheel mode.

In the drive device according to the present invention, the freewheel mode detection means detects whether the freewheel diode is in the freewheel mode on the basis of the detection signal transferred from the current detection means, and the inhibition means then inhibits the turning-on operation of the switching element equipped with the freewheel diode on the basis of the detection result of the freewheel mode detection means. These processes requires a predetermined time period. Accordingly, the actual timing to perform such an inhibition process is delayed by this predetermined time period.

When the timing to perform the inhibition process is delayed on the basis of the detection result of the transition of the freewheel diode from the freewheel mode to the non-freewheel mode, there is a possibility for the inhibition means to instruct the switching element to be turned off during the timing when the switching element must be turned on in order to flow a current in this switching element.

In order to avoid such an error or incorrect operation from occurring, the drive device according to the present invention uses the threshold current value which is shifted toward a value with which the switching element can be correctly and timely turned off simultaneously when a forward current flows in the freewheel diode, without any delay time. That is, it is possible for the drive device according to the present invention to avoid the output of the instruction to release the inhibition instruction of the turning-on operation of the switching element from being delayed from the timing when the state of the freewheel diode is switched from the freewheel mode to the non-freewheel mode. In other words, according to the drive device of the present invention, it is possible to simultaneously execute the releasing operation to release the turning-off operation of the switching element at the same timing when the state of the freewheel diode is switched from the freewheel mode to the non-freewheel mode.

In the drive device as another aspect of the present invention, the freewheel mode detection means uses a first threshold value and a second threshold value which are different with each other, wherein the first threshold value is used when the state of the freewheel diode is switched from non-freewheel mode to the freewheel mode, and the second threshold value is used when the state of the freewheel diode is switched from the freewheel mode to the non-freewheel mode.

According to the present invention, it is possible to avoid hunting phenomenon in detection of the freewheel mode, in which the freewheel mode and the non-freewheel mode are frequently switched in the freewheel diode. It is thereby possible for the inhibition means to avoid a high frequency operation to switch the inhibition process and the releasing process.

In the drive device as another aspect of the present invention, the drive device receives an operation signal which controls the operation of the switching element in a high voltage side and an operation signal which controls the operation of the switching element in a low voltage side, and controls the operation of these switching elements on the basis of the received operation signals. These operation signals are complementary signals which are capable of alternately turning on and turning off the switching elements in a high voltage side and the switching element in a low voltage side. The inhibition means receives the operation signals to control the switching element in a high voltage side and the operation signal to control the switching element in a low voltage side, and switches the received operation signal to the operation signal which instructs the switching element to be turned off when the received operation signal instructs the switching element to be turned on according to the detection result by the freewheel mode detection means.

According to the present invention, it is possible for the inhibition means to execute the inhibition process and the releasing process without increasing an arithmetic operation load of the means which generates the complementary signals.

In the drive device as another aspect of the present invention, the inductor is mounted to an electric rotary machine such as a motor generator. The drive device further has the means for executing software programs. The software programs have a function of generating the operation signals in order to control the operation of the switching element in a high voltage side and the switching element in a low voltage side. This can adjust control values of the electric rotary machine. The freewheel mode detection means and the inhibition means are realized by executing the software programs.

In the drive device as another aspect of the present invention, the inductor is mounted to a motor generator as an on-vehicle main device. The freewheel mode detection means and the inhibition means form a low voltage system which is electrically insulated from a high voltage system equipped with the electric power conversion circuit and the motor generator.

In general, the current detection means for detecting a current, for example, detecting a phase current of an electric rotary machine, is electrically insulated from the electrical paths connected between the electric rotary machine and the electric power conversion circuit such as an inverter. When the means for generating the complementary signals is arranged in a low voltage system, it is possible to eliminate any insulation means on the electrical path through which a detection signal from the current detection means is transferred to the freewheel mode detection means and the inhibition means.

In accordance with another aspect of the present invention, there is provided a drive device for controlling an operation of an electric power conversion circuit. The electric power conversion circuit is equipped with a plurality of pairs of switching elements. Each of the pairs is comprised of a switching element in a high voltage side and a switching element in a low voltage side. The switching element in a high voltage side and a switching element in a low voltage side are connected in series. A positive electrode of a direct current power source is connected to each phase of a three-phase electric rotary machine through the switching element in a high voltage side. Further, a negative electrode of the direct current power source is connected to each phase of the three phase electric rotary machine through the switching element in a low voltage side. At least of one of the switching elements in the pair is equipped with a freewheel diode. The switching element and the freewheel diode are connected in parallel with each other. A connection node between the switching element in a high voltage side and the switching element in a low voltage side in each pair is connected to an inductor. The drive device has a freewheel mode detection means and an inhibition means. The freewheel mode detection means detects whether or not the state of the freewheel diode is in the freewheel mode in which a current flows in the freewheel diode on the basis of a detection result of a first current detection means and a detection result of a second current detection means. The first current detection means detects a current flowing in a first phase of the electric rotary machine. The second current detection means detects a current flowing in the second phase of the electric rotary machine. The inhibition means inhibits the turning-on operation of the switching element connected in parallel to the freewheel diode which is in the freewheel mode. In particular, the inhibition means has a first phase detection means, a second phase detection means, and a third phase detection means. The first phase detection means detects whether or not the freewheel diode in a first phase is in the freewheel mode on the basis of a current value flowing in the first phase of the electric rotary machine detected by the first current detection means. The second phase detection means detects whether or not the freewheel diode in a second phase is in the freewheel mode on the basis of a current value flowing in the second phase of the electric rotary machine detected by the second current detection means. The third phase detection means detects whether or not the freewheel diode in a third phase is in the freewheel mode on the basis of a comparison result between the current value flowing in the first phase of the electric rotary machine detected by the first current detection means and an inverted value of the current value flowing in the second phase of the electric rotary machine detected by the second current detection means.

It takes a delay time until an actual operation to inhibit the turning-on instruction of the operation signal after the freewheel mode detection means detects the actual timing when the freewheel diode is in the freewheel mode by using the current values detected by the first current detection means and the second current detection means.

Such a delay time would cause various problems when compared with the method to perform the above inhibition process on the basis of a small current detected through small-sized electrodes. The small-sized electrodes are directly formed on the same semiconductor substrate on which the freewheel diode is also formed.

The inventors of the present invention provide the drive device according to the present invention on the basis of the following reason.

On detecting the freewheel mode of the freewheel diode, the detection accuracy obtained by a conventional technique on the basis of such a small current detected through the small-sized electrodes is decreased more than the detection accuracy of the freewheel mode obtained by the drive device using the first current detection means and the second current detection means according to the present invention. This means that it is better to perform the inhibition process by using the first current detection means and the second current detection means. In this viewpoint, the drive device according to the present invention performs the inhibition process by using the first current detection means and the second current detection means.

In general, the total sum of currents flowing in three phases (U phase, V phase, and W phase) of the three phase electric rotary machine becomes zero. This means that the current value flowing in third phase has a current value which is obtained by inverting in sign the sum of the current value flowing in the first phase and the current value flowing in second phase. The timing when the current value flowing in three phase is inverted is the timing when the inequality between the current value flowing in first phase and the inverted current value flowing in second phase is reversed. It is possible to correctly detect the occurrence of the freewheel mode in the freewheel diode in third phase without using any third current detection means to detect the current flowing in third phase on the basis of this relationship.

In the drive device as another aspect of the present invention, at least one of the switching element in a high voltage side and the switching element in a low voltage side in each pair and the freewheel diode connected in parallel to the switching element is formed on the same semiconductor substrate. That is, the switching element and the freewheel diode connected in parallel to this switching element are formed on the same semiconductor substrate where the switching element is at least one of the switching element in a high voltage side and the switching element in a low voltage side in each pair.

In general, the freewheel diode has a large conductive power loss when the switching element is turned on when compared with the conductive power loss when the switching element is turned off. The inhibition means can effectively decrease the conductive power loss, namely, electric power loss of the electric power conversion circuit such as an inverter.

In the drive device as another aspect of the present invention, the third phase detection means adjusts at least one of the current value of one phase and the inverted current value of other phase, and compares these current values in order to offset a boundary voltage, at which the freewheel mode of the freewheel diode is detected, toward a voltage side at which a forward current flows in the freewheel diode.

In the drive device according to the present invention, the freewheel mode detection means detects the occurrence of the freewheel mode of the freewheel diode on the basis of the phase current values transferred from the first and second current detection means. The inhibition means then inhibits the turning-on operation of the switching element on the basis of the detection result of the freewheel mode detection means. These processes require a predetermined time period. Accordingly, the actual timing to perform such an inhibition process is delayed by this predetermined time period.

When the timing to perform the inhibition process is delayed on the basis of the detection result of the transition from the freewheel mode to the non-freewheel mode, there is a possibility for the inhibition means to instruct the switching element to be turned off when the switching element must be turned on, and a current must flow in the switching element.

In order to avoid such a drawback, the drive device according to the present invention can avoid the releasing operation of the inhibition by the inhibition means from being delayed from the time when the freewheel diode is switched from the freewheel mode to the no-freewheel mode by offsetting the above unmatched time toward the direction where the forward current flows in the freewheel diode.

In the drive device as another aspect of the present invention, the third phase detection means uses different offset values in following two cases (I) and (II): (I) when the state of the freewheel diode is switched from non-freewheel mode to the freewheel mode; and (II) when the state of the freewheel diode is switched from the freewheel mode to the non-freewheel mode.

According to the present invention, it is possible to avoid hunting phenomenon in detection of the freewheel mode, in which the freewheel mode and the non-freewheel mode are frequently switched in the freewheel diode. It is thereby possible for the inhibition means to avoid a high frequency operation to switch the inhibition process and the releasing process.

In the drive device as another aspect of the present invention, the first current detection means detects a current as a positive current. This current flows from one of the electric power conversion circuit and the three phase electric rotary machine to the other. The second current detection means detects as a positive current an inverted current of the above positive current.

According to the present invention, it is possible for the inhibition means to execute the inhibition process and the releasing process without increasing an arithmetic operation load of the means which generates the complementary signals.

In the drive device as another aspect of the present invention, the drive device receives an operation signal which controls the operation of the switching element in a high voltage side and an operation signal which controls the operation of the switching element in a low voltage side. The drive device controls the operation of these switching elements on the basis of the operation signals, and these operation signals are complementary signals capable of alternately turning on/off the switching element in a high voltage side and the switching element in a low voltage side. The inhibition means receives the operation signal which controls the operation of the switching element in a high voltage side and the operation signal which controls the operation of the switching element in a low voltage side, and switches the received operation signal to the operation signal which instructs the switching element to be turned off when the received operation signal instructs the switching element to be turned on according to the detection result by the freewheel mode detection means.

According to the present invention, it is possible for the inhibition means to perform the inhibition process without increasing the arithmetic load of the means for generating the complementary signals.

In the drive device as another aspect of the present invention, the drive device further comprises means for executing software programs capable of generating the operation signals to control the operation of the switching element in a high voltage side and the switching element in a low voltage side in order to adjust control values of the three phase electric rotary machine. The freewheel mode detection means and the inhibition means are realized by executing software programs.

In the drive device as another aspect of the present invention, the three phase electric rotary machine is an on-vehicle main device. The freewheel mode detection means and the inhibition means forms a low voltage system which is electrically insulated from a high voltage system equipped with the electric power conversion circuit and the electric rotary machine.

In general, the current detection means for detecting a current, for example, detecting a phase current is electrically insulated from the electrical paths connected between a three phase electric rotary machine and the electric power conversion circuit such as an inverter. When the means for generating the complementary signals is arranged in a low voltage system, it is possible to eliminate any insulation means on the electrical path through which a detection signal from the current detection means is transferred to the freewheel mode detection means and the inhibition means.

BRIEF DESCRIPTION OF THE DRAWINGS

A preferred, non-limiting embodiment of the present invention will be described by way of example with reference to the accompanying drawings, in which.

DETAILED DESCRIPTION OF THE PREFERRED EMBODIMENTS

Figure 1:
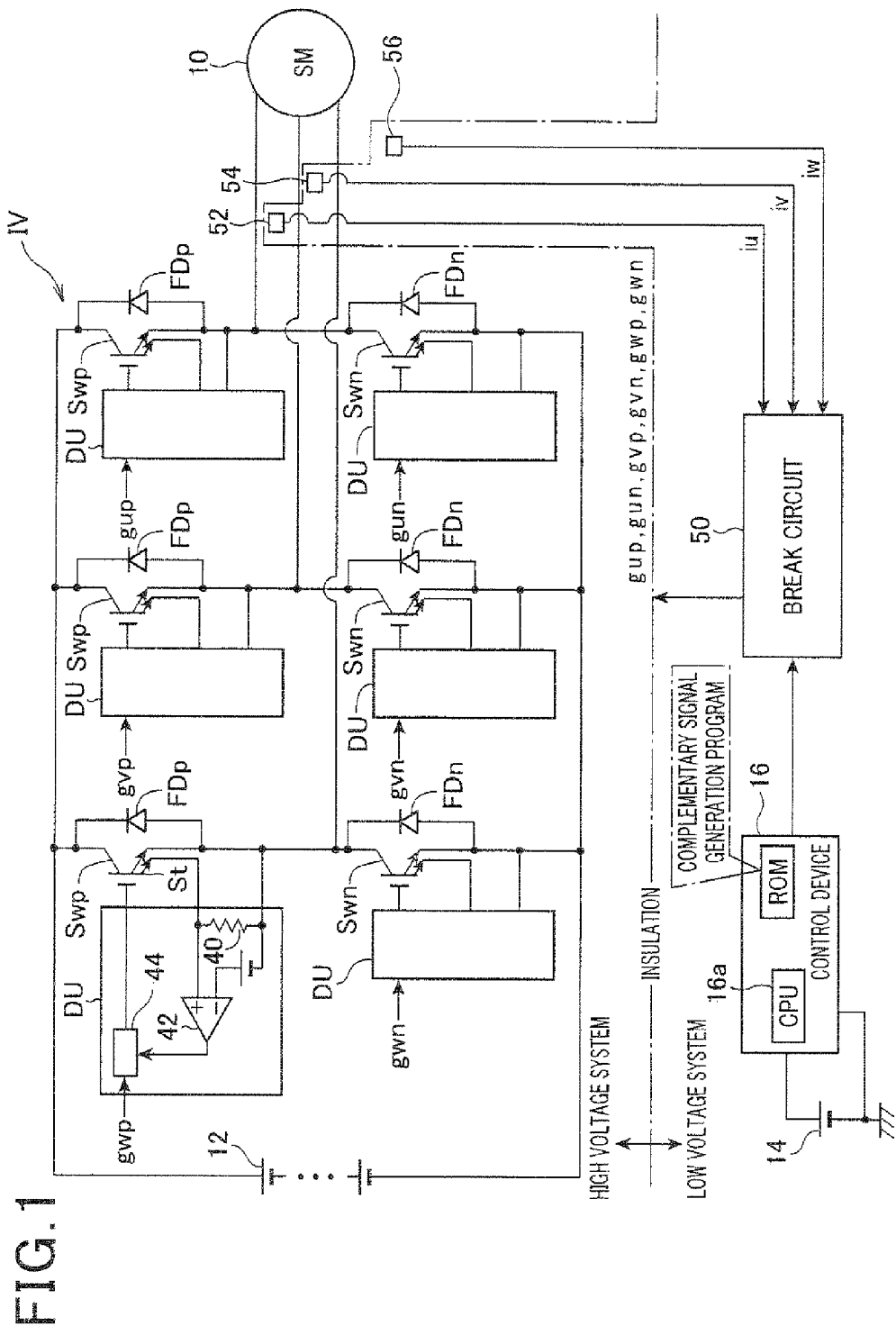
FIG. 1 is a view showing a configuration of the system comprised of a motor generator, an inverter as an electric power conversion circuit comprised of IGBTs as power switching elements in high voltage side and in low voltage side and built-in freewheel diodes, and the drive device comprised of a control device, a break circuit, and drive units DU according to a first embodiment of the present invention.

Hereinafter, various embodiments of the present invention will be described with reference to the accompanying drawings. In the following description of the various embodiments, like reference characters or numerals designate like or equivalent component parts throughout the several diagrams.

First Embodiment

A description will be given of the control device which controls the operation of an electric power conversion circuit according to a first embodiment of the present invention with reference to FIG. 1 to FIG. 5.

FIG. 1 is a view showing a configuration of the system comprised of the motor generator 10, the inverter IV as an electric power conversion circuit, and the drive device according to the first embodiment. The drive device is comprised mainly of the control device 16, the break circuit 50, and the drive units DU. The number of the drive units DU corresponds to the number of pairs of power switching elements Sw (Swp, Swn). As will be described later, each pair is comprised of a power switching element Swp (such as an insulated gate bipolar transistor (IGBT)) in high voltage side and a powers switching element Swn such as IGBT in a low voltage side which are connected in series. The inverter IV as an electric power conversion circuit is equipped with the power switching elements Sw (Swp, Swn) to be controlled by the drive device according to the first embodiment.

As shown in FIG. 1, the motor generator 10 as the on-vehicle main device is electrically connected to a high voltage battery 12 through the inverter IV.

The inverter IV is comprised of three pairs of power switching elements. That is, the three pairs are connected in parallel. Each of the three pairs is comprised of a power switching element Swp in a high voltage side and a power switching element Swn in the low voltage side which are connected in series.

A connection node between the power switching element Swp in the high voltage side and the power switching element Swn in the low voltage side in each pair is electrically connected to a corresponding phase terminal of the motor generator 10.

A freewheel diode FDp is connected in parallel to the power switching element Swp in the high voltage side. A freewheel diode FDn is also connected in parallel to the power switching element Swn in a low voltage side. In more detail, the input terminal and the output terminal of the power switching element Swp in the high voltage side are connected to the cathode and the anode of the freewheel diode FDp in the high voltage side, respectively. The input terminal and the output terminal of the power switching element Swn in the low voltage side are connected to the cathode and the anode of the freewheel diode FDn in the low voltage side, respectively.

On the other hand, the control device 16 operates under the low voltage battery 14, and controls the operation of the inverter IV in order to control various parameters of the motor generator 10 as a control target.

The control device 16 generates operation signals gup, gyp, gwp of the power switching elements Swp in U phase, V phase, and W phase of the motor generator 10 on the basis of current values as detection results of current sensors 52, 54, and 56. Further, the control device 16 generates operation signals gun, gvn, gwn of the power switching elements Sw in U phase, V phase, and W phase of the motor generator 10 on the basis of current values as detection results of the current sensors 52, 54, and 56.

The power switching elements Sw (Swp, Swn) in the electric power conversion circuit as the inverter IV are driven by the control device 16 and the break circuit 50 through the drive units DU. That is, each of the drive units DU is connected to the conductive control terminal (gate terminal) of the corresponding power switching element Sw (Swp, Swn).

The high voltage system equipped with the inverter IV is electrically insulated from the low voltage system equipped with the control device 16 and the break circuit 50 by an electrical insulation means such as a photo coupler.

The control device 16 and the break circuit 50 in the low voltage system generate the operation signals gup, gvp, gwp, gun, gvn, gwn, etc. The operation signals gup, gyp, gwp, gun, gvn, gwn, etc. are then transferred to the drive units DU in the high voltage system through the insulation means such as a photo coupler.

The current sensors 52, 54, and 56 detect current flowing in electrical lines of U phase, V phase, and W phase, respectively. The current sensors 52, 54, and 56 also detect the direction of the current flowing in the electrical lines of U phase, V phase, and W phase.

In the system configuration shown in FIG. 1, the current sensors 52, 54, and 56 are arranged in the low voltage system side because these current sensors 52, 54, and 56 are non-contact type sensor, and capable of detecting the current flowing through the electrical lines which are placed between the motor generator 10 and the inverter IV without any electrical contact member and insulation means.

Each of the power switching elements Sw (Swp, Swn) inhibits the current flowing from the output terminal to the input terminal thereof. Each of the power switching elements Sw (Swp, Swn) is composed of an insulation gate bipolar transistor (IGBT).

Each of the power switching elements Sw (Swp, Swn) has a sense terminal St in order to detect small currents. The small currents indicate a correlation between the current flowing in the input and output terminals of the power switching element Sw (Swp, Swn) and the current flowing in the freewheel diode FD (FDp, FDn).

The configuration of such an IGBT with a built-in freewheel diode can provide the function of the sense terminal St. That is, in the configuration of the drive device according to the first embodiment, the power switching element Swp and the freewheel diode FDp in the high voltage side are formed adjacent to each other on the same semiconductor substrate, and the power switching element Swn and the freewheel diode FDn in the low voltage side are formed adjacent to each other on the same semiconductor substrate.

Figure 2A:
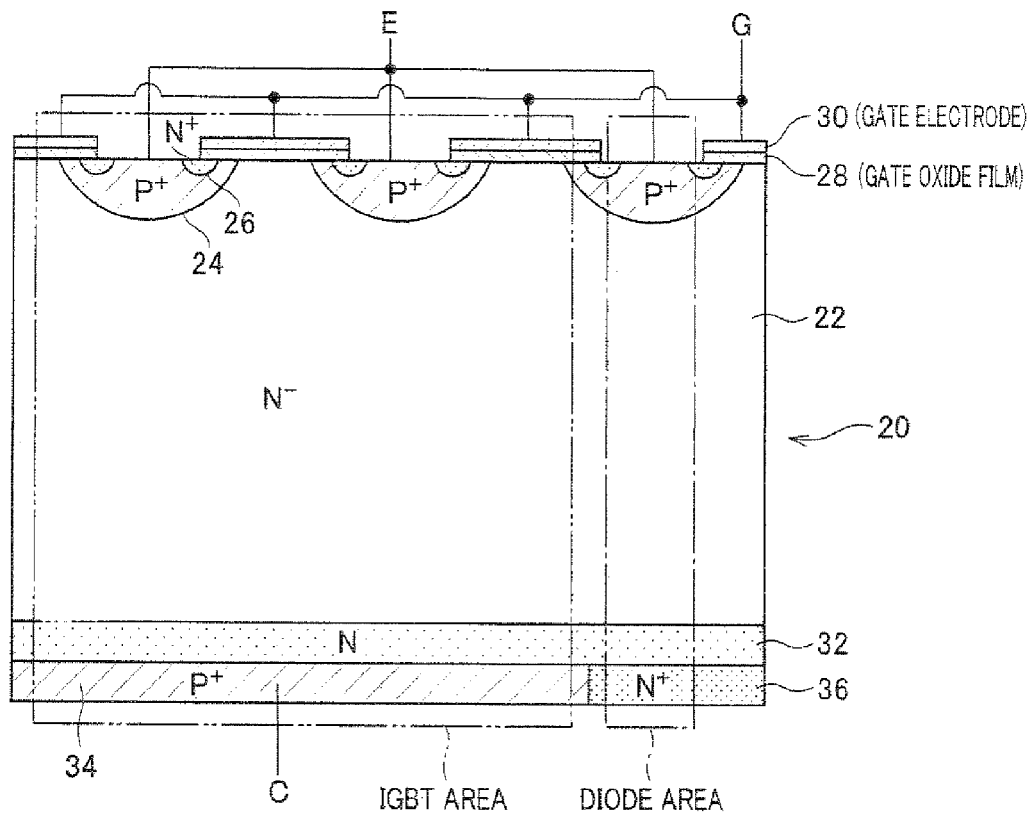
FIG. 2A is a view showing a cross section of the IGBT with the built-in freewheel diode in the electric power conversion circuit controlled by the drive device according to the first embodiment shown in FIG. 1.
Figure 2B:
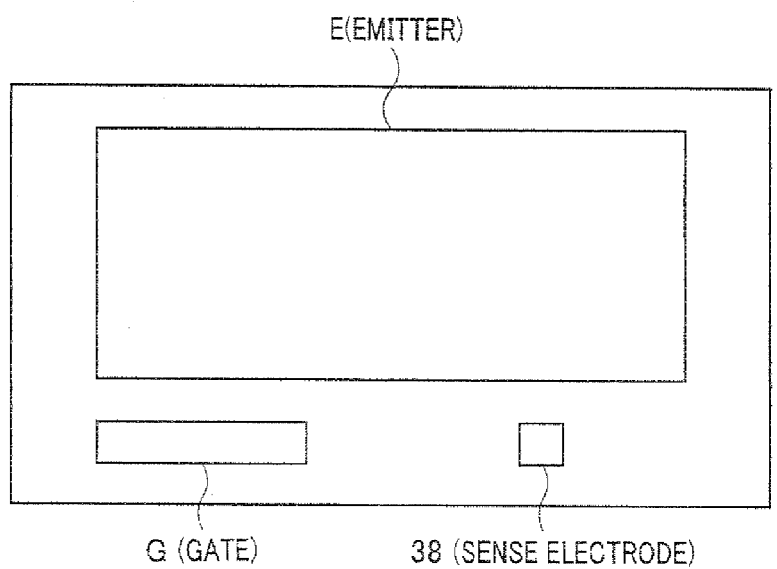
FIG. 2B is a view showing a cross section of the freewheel diode built in the IGBT shown in FIG. 2A.

FIG. 2A is a view showing a cross section of an IGBT (Swp, Swn) with a built-in freewheel diode FD (FDp, FDn) which is controlled by the drive unit DU in the drive device according to the first embodiment shown in FIG. 1. FIG. 2B is a view showing a cross section of the freewheel diode FD (FDp, FDn) built in the IGBT shown in FIG. 2A.

In the following explanation, reference character "Sw" of the power switching elements represents both the power switching elements Swp and the power switching elements Swn, and reference character "FD" indicates both the built-in freewheel diodes FDp, FDn.

As shown in FIG. 2A and FIG. 2B, the IGBT region and the freewheel diode region are adjacent with each other. In addition, the IGBT region and the freewheel diode region are formed on the same semiconductor substrate 20. The region extending from the main surface toward the back surface of the semiconductor substrate 20 is a N type region 22 of a N conductivity type.

The P conductive type region (P type region for short) 24 is formed on main the surface of the semiconductor substrate 20. The N conductive type region (N type region for short) 26 is formed in the P type region 24. The N type region 26 has a high concentration rather than the concentration of the N type region 22. The P type region 24 and the N type region 26 are connected to the emitter terminal E of the IGBT and the anode terminal of the freewheel diode. A gate electrode 30 is formed on the P type region 24 and the N type region 26 through the gate oxide film 28.

On the other hand, the N type region 36 and the P type region 34 are formed adjacent with each other on the back surface of the semiconductor substrate 20. The N type region 36 has a high concentration rather than that of the N type region 22.

The P type region 34 forms the collector region of the IGBT, the N type region 36 forms the cathode region of the freewheel diode. The N type region 32 is formed between the N type region 22 and the region composed of the P type region 34 and the N type region 36. The N type region 32 has a lower concentration than the concentration of the N type region 22.

FIG. 2B is a plan view showing the main surface of the semiconductor substrate 20. As shown in FIG. 2B, the emitter region. E occupies a large part of the main surface of the semiconductor substrate 20. The gate region G and the sense electrode 38 occupy the remaining region of the main surface of the semiconductor substrate 20. An actual area size of the sense electrode 38 is a one several-thousandth of the area of the emitter region E. This makes it possible to output a small current while having a correlation with the current flowing in the IGBT and the freewheel diode.

The drive unit DU has the function to forcedly turn off the power switching element Sw (Swp, Swn) when the detected current flowing between the input terminal (collector terminal) and the output terminal (emitter terminal) of the power switching element Sw is excessively a large value in addition to having the function to turn on and turn off the power switching elements on the basis of the operation signals g (gup, gvp, gwp, gun, gvn, gwn). In more detail, the drive unit DU forcedly turns off the power switching element Sw when the current flowing between the input terminal and the output terminal of the power switching element is not less than a threshold current value Ith on the basis of the small current which is output from the sense terminal St of the power switching element Sw.

As shown in the upper column of FIG. 1, a combination of the resistance 40 and the comparator 42 in the drive unit DU can provide the above function. That is, the comparator 42 compares the voltage drop value in the resistance 40 when a small current from the sense terminal St flows in the resistance 40 with the threshold voltage value Vth corresponding to the threshold current value Ith. The comparison result of the comparator 42 is transferred to the drive circuit 44 which performs the charging and discharging operation of the gate terminal of the power switching element Sw. The drive circuit 44 in the drive unit DU turns off the power switching element Sw when the drive unit DU detects that the current flowing in the power switching element Sw exceeds the threshold current value Ith.

The control device 16 is equipped with a central processing unit (CPU) 16a, and performs an application program to generate the operation signal g, where the operation signal g is a general term for the operation signals gup, gyp, gwp, gun, gvn, gwn, etc.

The control device 16 has heavy load in processing when it generates these operation signals gup, gyp, gwp, gun, gvn, gwn, etc. in addition to performing the detection whether or not the freewheel diode FD is in the freewheel mode in which a current flowing in the freewheel diode FD during flowing no current in the power switching element Sw, but a current flows in the freewheel diode FD, where the power switching element Sw and the freewheel diode FD are connected in parallel with each other. In order to avoid this drawback, the control device 16 generates the operation signals g which serve as complementary signals capable of instructing the power switching element Sw in the high voltage side and the power switching element Sw in the low voltage side to be alternately turned on and off regardless of the freewheel mode of the freewheel diode FD.

When the IGBT equipped with the built-in freewheel diode FD is used as the power switching element Sw, the power loss of the power switching element Sw is increased when the power switching element Sw is turned on under the freewheel mode of the built-in freewheel diode FD where a current flows in the freewheel diode.

When the freewheel mode of the built-in freewheel diode FD is detected, it is necessary for the control device 16 to have the function to rapidly and timely cancel the turning-on instruction of the operation signal g. It is necessary for the drive unit DU to cancel the turning-on instruction of the operation signal g transferred from the control device 16 on the basis of the output of the sense terminal St of the power switching element Sw when the built-in freewheel diode FD is in the freewheel mode. This makes it possible to rapidly execute the operation to turn off the power switching element Sw when the freewheel diode FD is in the freewheel mode. That is, it requires a predetermined delay time period until the drive unit DU cancels the turning-on instruction of the operation signal g after the drive unit DU detects the outputs transferred from the current sensors 52, 54, and 56. In general, a small current output from the sense terminal St does not adequately correspond to the current flowing between the input terminal and the output terminal of the power switching element Sw.

Figure 3:
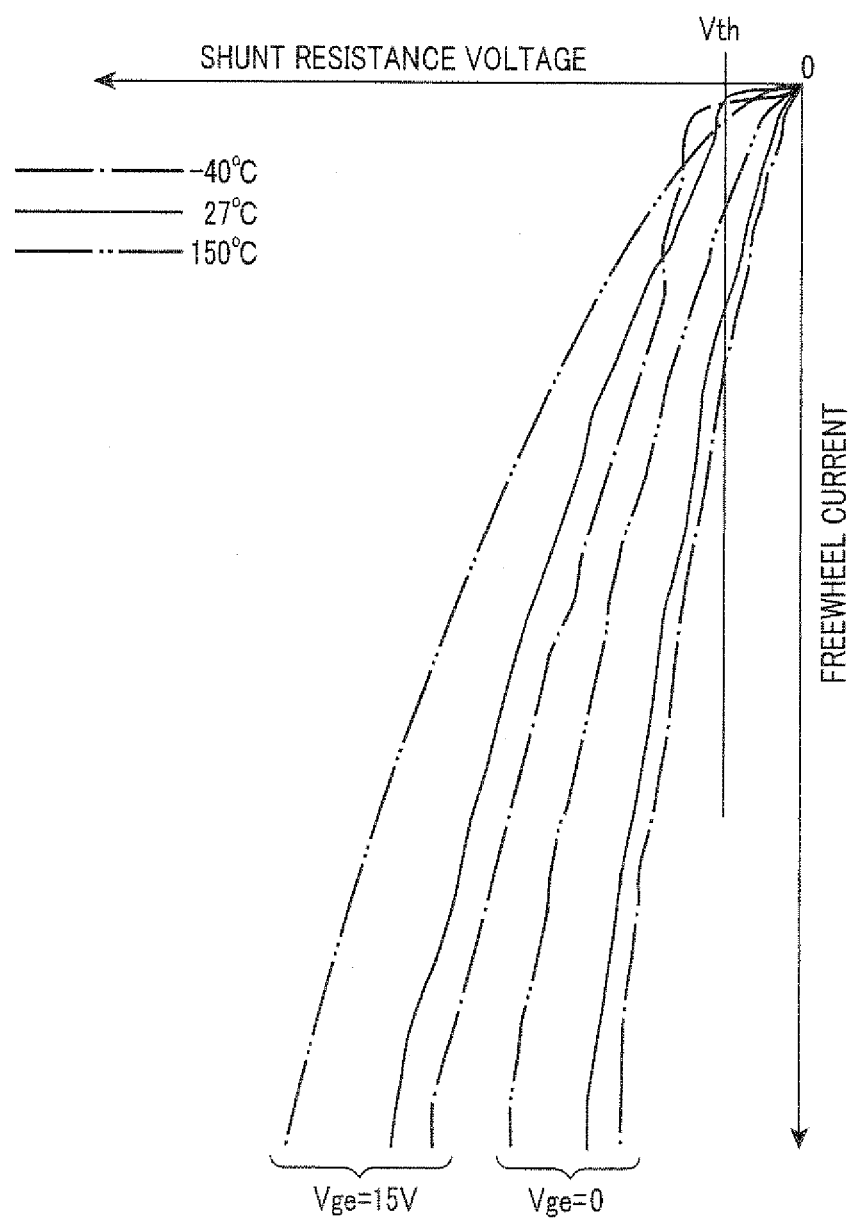
FIG. 3 is a view showing a relationship between a voltage drop amount (shunt resistance voltage) of a resistance and a forward current (freewheel current) flowing in the built-in freewheel diode FD which is arranged in parallel to the power switching element Sw (Swp, Swn) as an IGBT shown in FIG. 1.

FIG. 3 is a view showing a relationship between a voltage drop amount (shunt resistance voltage) of the resistance 40 and a forward current (freewheel current) flowing in the freewheel diode FD which is arranged in parallel to the power switching element Sw (Swp, Swn) as IGBT shown in FIG. 1.

In particular, FIG. 3 shows the relationship between temperatures (−40° C. 27° C. and 150° C.) of the freewheel diode FD and following two cases (1) and (2):

(1) When the voltage Vge between the gate terminal and the emitter terminal of the power switching element Sw is zero volt (Vge=0 V); and (2) When the voltage Vge between the gate terminal and the emitter terminal of the power switching element Sw is 15 Volts (Vge=15 V).

As shown in FIG. 3, the voltage drop value of the resistance 40 drastically varies according to the change of the voltage Vge and the temperature of the freewheel diode FD. This indicates a possibility that the current flowing in the freewheel diode FD becomes a large value on the voltage Vge and the temperature of the freewheel diode when the voltage of the shunt resistance is not less than the threshold voltage value Vth.

It is difficult to eliminate the influence on the basis of the above voltage Vge and the temperature of the freewheel diode FD by changing the threshold voltage value Vth because the voltage drop value corresponding to the voltage Vge and the temperature described above is fluctuated by the individual difference of the IGBT and the freewheel diode manufactured. This means that it is difficult to detect the freewheel mode immediately after the freewheel diode FD enters the freewheel mode in which a small current flows therein. This causes increasing the power loss of the power switching element Sw, that is, the power loss of the IGBT equipped with the built-in freewheel diode FD.

In the configuration of the drive device according to the first embodiment shown in FIG. 1, the break circuit 50 receives the current values transferred from the current sensors 52, 54, and 56 in U phase, V phase, and W phase of the motor generator 10, and adjusts the turning-on instruction of the operation signal g on the basis of the detection results. Specifically, the break circuit 50 inputs the operation signal g generated by and transferred from the control device 16, and adjusts the operation signal g, and outputs the adjusted operation signal g to each of the control units DU.

Figure 4:
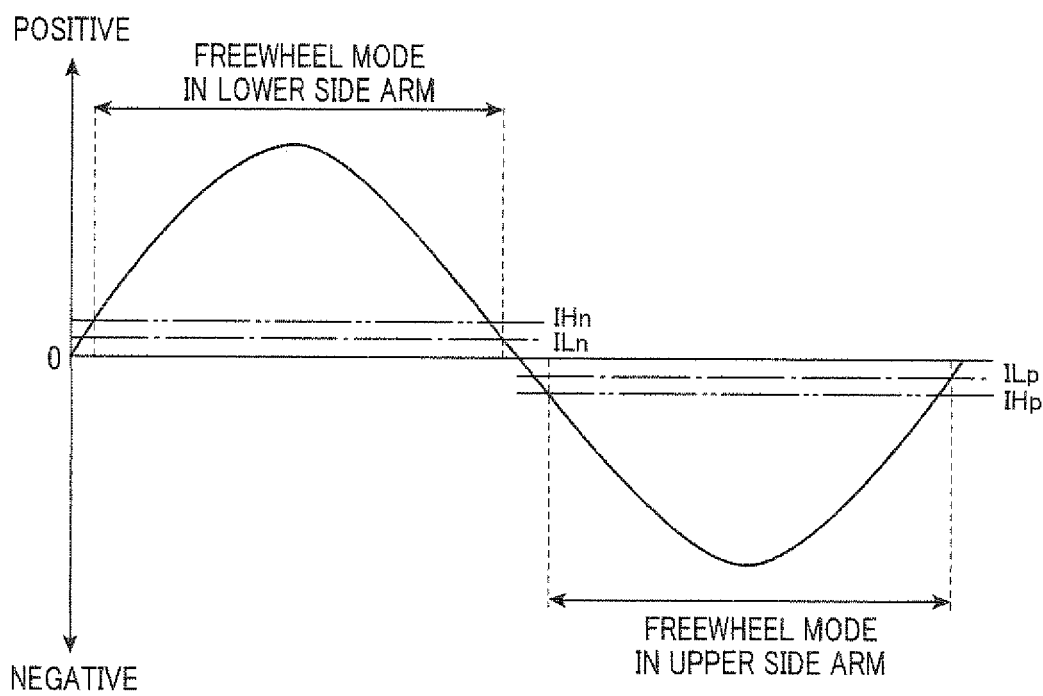
FIG. 4 is a timing chart showing a method of detecting a freewheel mode of the freewheel diode by the drive device according to the first embodiment shown in FIG. 1.

FIG. 4 is a timing chart showing an operation of detecting a freewheel mode performed by the break circuit 50 in the drive device according to the first embodiment shown in FIG. 1. The break circuit 50 performs such a special process. In the timing chart shown in FIG. 4, a positive current flows from the inverter IV as the electric power conversion circuit to the motor generator 10.

As shown in FIG. 4, when the current in one phase (U phase, V phase, or W phase) flowing in the motor generator 10 is not less than the threshold current value IHn (>0), the break circuit 50 detects the freewheel mode of the freewheel diode in the lower arm in this phase.

Further, when the current in one phase (U phase, V phase, or W phase) flowing in the motor generator 10 is not more than the threshold current value IHp (<0), the break circuit 50 detects the freewheel mode of the freewheel diode in the upper arm in this phase.

Still further, when the current in one phase (U phase, V phase, or W phase) flowing in the motor generator 10 is not more than the threshold current value ILn (>0), the break circuit 50 detects the freewheel mode of the freewheel diode in the lower arm in this phase. When the current in this phase (U phase, V phase, or W phase) flowing in the motor generator 10 is not less than the threshold current value ILp (<0), the break circuit 50 detects the freewheel mode of the freewheel diode in the upper arm in this phase.

In particular, the threshold current values ILn and ILp are determined in consideration of a delay time period counted from the timing when the current state is not in the freewheel mode on the basis of the outputs from the current sensors 52, 54, and 56 to the timing when the operation to cancel the turning-on instruction of the operation signal g is actually released.

On the other hand, when the threshold current values ILn, ILp are zero, there is a possibility of cancelling the turning-on instruction of the operation signal g in spite of not being in the freewheel mode caused by the time delay.

Still further, as previously described, the break circuit 50 uses the different threshold current values IHn and ILn where the threshold current value IHn is used for detecting that the lower arm is shifted to the freewheel mode, and the threshold current value ILn is used for detecting that the lower arm is shifted to a mode other than the freewheel mode.

Furthermore, the break circuit 50 uses the different threshold current values IHp and ILp where the threshold current value IHp is used for detecting that the upper arm is shifted to the freewheel mode, and the threshold current value ILp is used for detecting that the upper arm is shifted to a mode other than the freewheel mode. Using these threshold current values IHn, ILn, IHp, and ILp can increase the noise resistance capability. That is, the break circuit 50 frequently detects the freewheel mode and the non-freewheel mode because each of the phase currents flowing in the motor generator 10 is a very small current value, and noises affect the detection operation of the break circuit 50. This turns on and turns off the power switching element Sw with a high frequency, and generates heat energy in the power switching element Sw, and the temperature of the power switching element equipped with the built-in freewheel diode FD is increased.

It is possible to set a predetermined value as the time period counted from the timing when the current is not less than the threshold current value IHn to the timing when the current becomes not more than the threshold current value ILn, and/or when the current is not less than the threshold current value IHp to the timing when the current becomes not more than the threshold current value ILp, where the predetermined value is longer than a detection time period to detect the freewheel mode on the basis of the voltage drop of the resistance 40. This is the reason why the break circuit 50 does not cancel the turning-on instruction of the operation signal g on the basis of the current signals transferred from the current sensors 52, 54, and 56.

Figure 5:
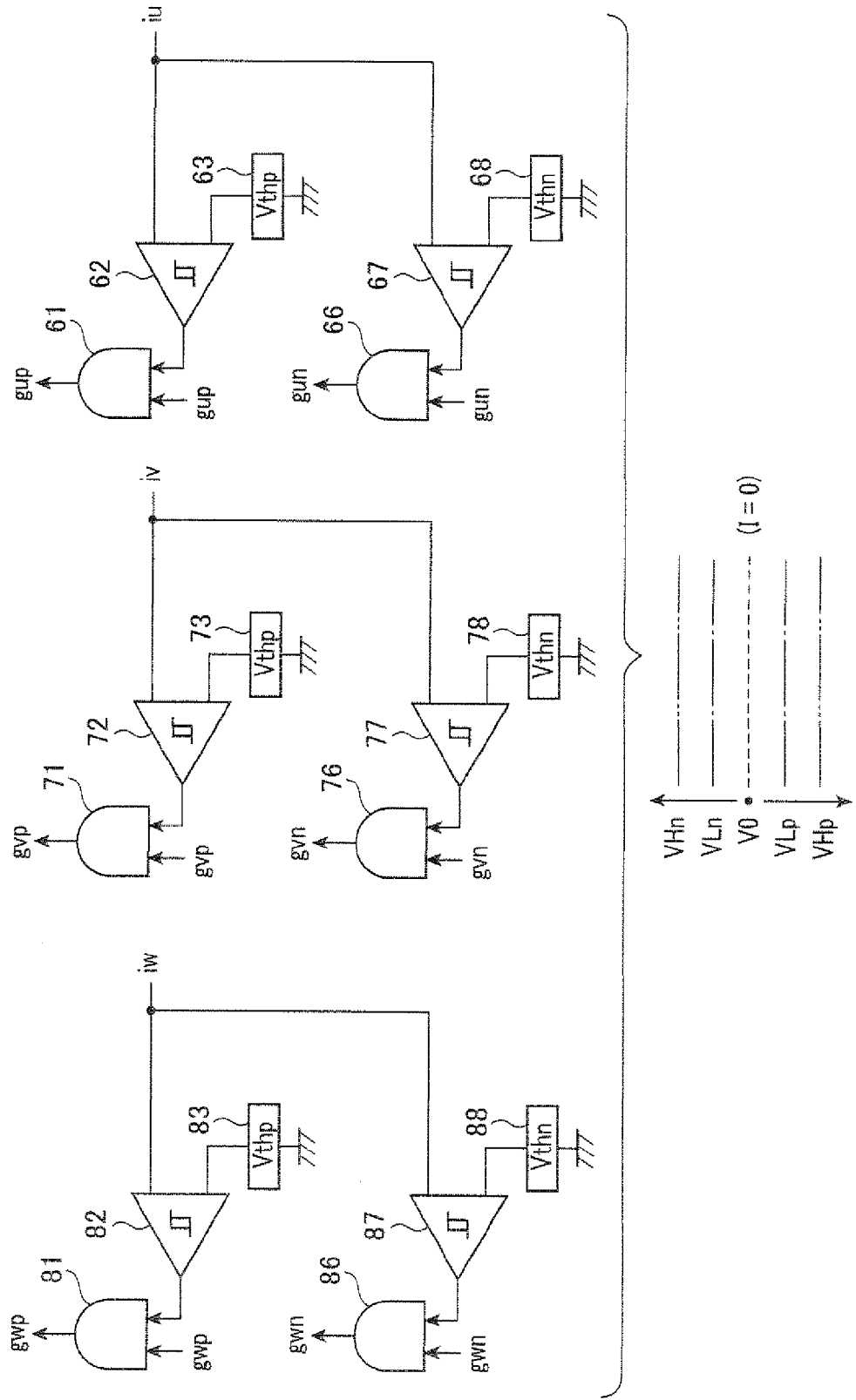
FIG. 5 is a view showing a configuration of the break circuit in the drive device according to the first embodiment in the system shown in FIG. 1.

FIG. 5 is a view showing a configuration of the break circuit 50 in the drive device according to the first embodiment in the system shown in FIG. 1.

As shown in FIG. 5, a hysteresis comparator 62 inputs the current value iu (in actual, corresponding to a voltage signal) in U phase detected by the current sensor 52 and a reference voltage value Vthp of a reference power source 63. An AND circuit 61 inputs the output signal transferred from the hysteresis comparator 62 and the operation signal gup transferred from the control device 16. The AND circuit 61 performs a logical product between them, and outputs a logical product signal as the operation signal gup in order to control the operation of the upper arm in U phase.

The hysteresis comparator 62 generates the threshold value VHp and VLp shown at the bottom row in FIG. 5. The threshold value VHp corresponds to the threshold current value IHp, and the threshold value VLp corresponds to the threshold current value ILp shown in FIG. 4.

As in the case for the hysteresis comparator 62 described above, a hysteresis comparator 67 inputs the current value iu (actually, a voltage signal) in U phase detected by the current sensor 52 and a reference voltage Vthn of a reference power source 68. An AND circuit 66 inputs the output signal transferred from the hysteresis comparator 67 and the operation signal gun of the lower arm in U phase transferred from the control device 16. The AND circuit 66 performs a logical product between them and outputs a logical product signal as the operation signal gun in order to control the operation of the lower arm in U phase.

The hysteresis comparator 67 generates the threshold value VHn and VLn shown at the bottom row in FIG. 5. The threshold value VHn corresponds to the threshold current value IHn, and the threshold value VLn corresponds to the threshold current value ILn shown in FIG. 4.

As in the case for the hysteresis comparator 62, a hysteresis comparator 72 inputs the current value iv (actually, a voltage signal) in V phase detected by the current sensor 54 and a reference voltage Vthp of a reference power source 73. An AND circuit 71 inputs the output signal transferred from the hysteresis comparator 72 and the operation signal gyp transferred from the control device 16. The AND circuit 71 performs a logical product between them and outputs a logical product signal as the operation signal gyp in order to control the operation of the upper arm in V phase.

Similarly, a hysteresis comparator 77 inputs the current value iv in V phase detected by the current sensor 54 and a reference voltage Vthn of a reference power source 78. An AND circuit 76 inputs the output signal transferred from the hysteresis comparator 77 and the operation signal gvn of the lower arm in V phase transferred from the control device 16. The AND circuit 76 performs a logical product between them and outputs a logical product signal as the operation signal gvn in order to control the operation of the lower arm in V phase.

Similarly, a hysteresis comparator 82 inputs the current value iw (actually, a voltage signal) in W phase detected by the current sensor 56 and a reference voltage Vthp of a reference power source 83. An AND circuit 81 inputs the output signal transferred from the hysteresis comparator 82 and the operation signal gwp transferred from the control device 16. The AND circuit 81 performs a logical product between them and outputs a logical product signal as the operation signal gwp in order to control the operation of the upper arm in W phase.

Similarly, a hysteresis comparator 87 inputs the current value iw (actually, a voltage signal) in W phase detected by the current sensor 56 and a reference voltage Vthn of a reference power source 88. An AND circuit 86 inputs the output signal transferred from the hysteresis comparator 87 and the operation signal gwn of the lower arm in W phase transferred from the control device 16. The AND circuit 86 performs a logical product between them and outputs a logical product signal as the operation signal gwn in order to control the operation of the lower arm in W phase.

The drive device according to the first embodiment of the present invention provides the following effects (1) to (5).

(1) The drive device according to the first embodiment detects the freewheel mode of the freewheel diode which is built in the power switching element Sw on the basis of the current information only. The current information is transferred from the current sensors 52, 54, ad 56. This makes it possible to expand the detectable current range or voltage range to detect the freewheel mode of the freewheel diode, and to decrease the electric power loss of the power switching element Sw such as IGBT equipped with the built-in freewheel diode FD when compared with the conventional detection method which uses, as the current information, an output current supplied from the sense terminal St of the power switching element Sw.

(2) In the configuration of the power switching elements Sw (Swp, Swn) to be controlled by the drive device according to the first embodiment, the power switching element Swp with the built-in freewheel diode FDp in the high voltage side and the power switching elements Swn with the built-in freewheel diode FDn in the low voltage side are arranged adjacent to each other on the same semiconductor substrate. This makes it possible to increase a conductive power loss when the power switching element Sw is turned on during the freewheel mode of the freewheel diode. Accordingly, the break circuit 50 in the drive device can easily detect the occurrence of the freewheel mode and to easily detect the timing to cancel the turning-on instruction of the operation signal g to turn on the power switching element Sw.

(3) The threshold current value is shifted from zero toward the forward current value side flowing in the freewheel diode FD in order to detect whether or not the freewheel diode FD is in the freewheel mode. This makes it possible to avoid any delay time period which is counted from the timing when the freewheel mode is switched to the non-freewheel mode by releasing the operation to cancel the turning-on instruction of the operation signal g.

(4) The break circuit 50 in the drive device according to the first embodiment uses the different threshold values such as threshold values IHp, IHn and the threshold values ILp and ILn, where the operation mode of the freewheel diode FD switched from the freewheel mode to the non-freewheel mode is detected by using the threshold value IHp and IHn, and the operation mode of the freewheel diode FD shifted from the non-freewheel mode to the freewheel mode is detected by using the threshold value ILp and ILn. This makes it possible to effectively avoid the high-frequency repetition of cancelling the turning-on instruction of the operation signal g and releasing this cancelling operation.

(5) The break circuit 50 cancels the turning-on instruction of the operation signal g as a complementary signal generated by performing an application program in the control device 16, and transferred from the control device 16. This makes it possible to effectively perform the canceling operation to cancel the turning-on instruction of the operation signal g without increasing the operation load of the control device 16.

Second Embodiment

A description will be given of the drive device according to the second embodiment of the present invention with reference to FIG. 6 and FIG. 7.

The difference in configuration between the second embodiment and the first embodiment will be explained below in detail. The explanation for the same components between the second embodiment and the first embodiment is omitted here.

Figure 6:
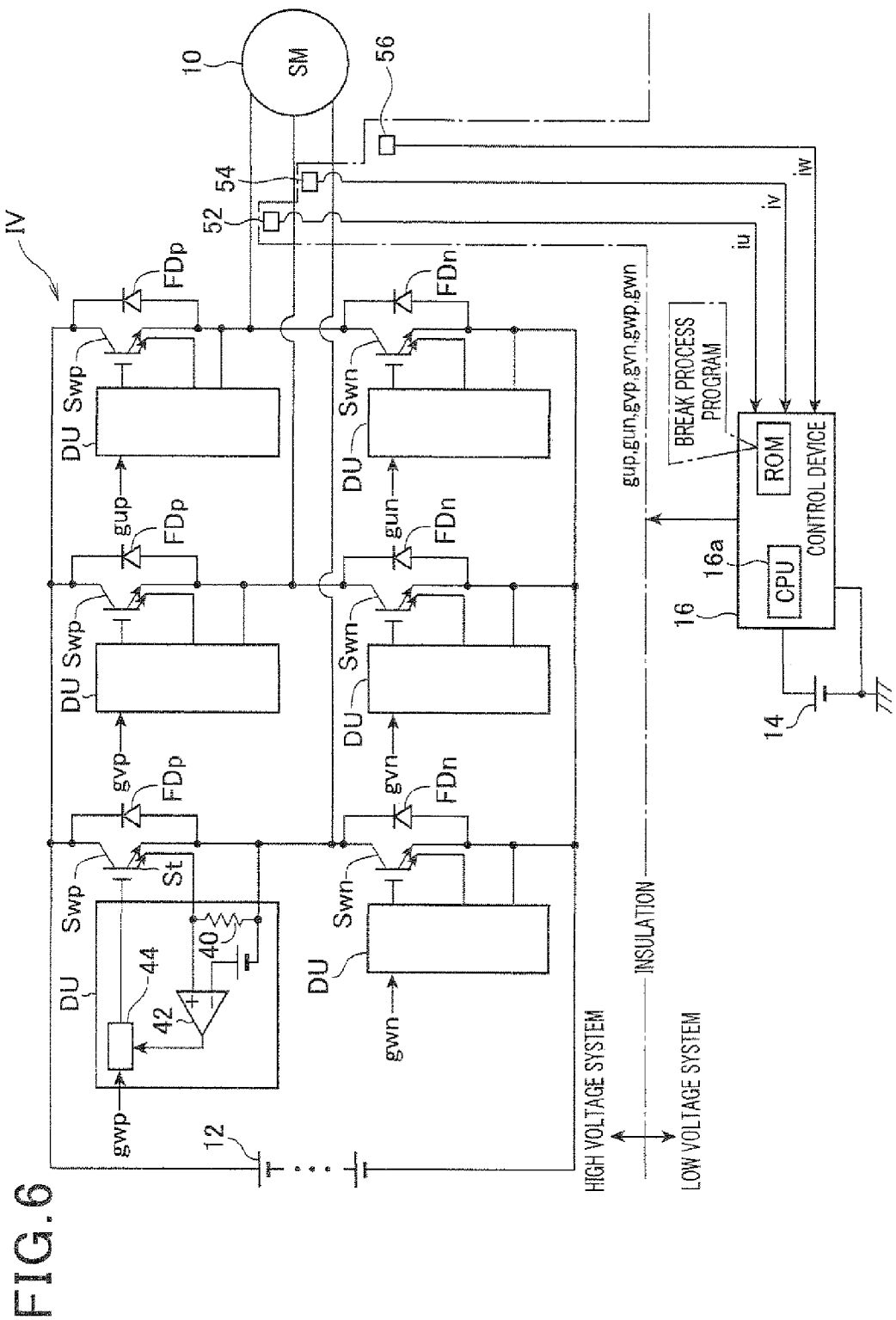
FIG. 6 is a view showing a configuration of the system comprised of a motor generator, an inverter as an electric power conversion circuit comprised of IGBTs as power switching elements in high voltage side and in low voltage side and built-in freewheel diodes, and the drive device comprised of a control device and drive units DU according to a second embodiment of the present invention.

FIG. 6 is a view showing another configuration of the system comprised of the motor generator 10, the inverter IV as an electric power conversion circuit, and the drive device according to the second embodiment. The drive device according to the present invention is comprised mainly of the control device 16 and the drive units DU without the break circuit 50.

That is, as shown in FIG. 6, the drive device according to the second embodiment is composed mainly of the control device 16 and the drive units DU without the break circuit 50. The break circuit 50 is used in the system of the first embodiment shown in FIG. 1.

The control device 16 executes application programs which execute the functions of the break circuit 50. Because the functions of the beak circuit 50 used in the system according to the first embodiment are previously described in detail, the explanation for these functions of the break circuit 50 is omitted here.

Because the control device 16 in the drive device according to the second embodiment can perform the same functions of the break circuit 50 used in the drive device according to the first embodiment, it is possible for the control device 16 to have the same effects provided by the break circuit 50.

Other Modifications (Means for Detecting Freewheel Mode of Freewheel Diode)

The break circuit 50 according to the first embodiment and the control device 16 according to the second embodiment previously described generate the different threshold current values in order to detect whether or not the freewheel diode FDp in the high voltage side is in the freewheel mode or the freewheel diode FDn in the low voltage side is in the freewheel mode by setting the hysteresis comparators 62, 67, 72, 77, 82, and 87. The present invention is not limited by this configuration. For example, it is possible to detect the freewheel mode of the freewheel diode by comparing a current value with the threshold value. This can be achieved by adjusting the current value itself or adjusting the output of the current sensor which detects the current.

The break circuit 50 and the control device 16 according to the first and second embodiments previously described use the different threshold current values in order to detect the two cases when the state of the freewheel diode FD is switched from the non-freewheel mode to the freewheel mode and the state of the freewheel diode FD is switched from the freewheel mode to the non-freewheel mode. The present invention is not limited by this configuration. It is possible for the drive device according to the present invention to obtain the above effect (1) without using these different threshold current values.

The break circuit 50 and the control device 16 according to the first and second embodiments previously described use the different threshold current values in order to detect whether or not the state of the freewheel diode FDp in the high voltage side is in the freewheel mode or the state of the freewheel diode FDn in the low voltage side is in the freewheel mode. The present invention is not limited by this configuration. It is possible for the drive device according to the present invention to obtain the above effect (1) without using the different threshold current values.

(Current Sensor)

In the drive devices according to the first and second embodiments previously described, the current sensors 52, 54, and 56 are provided in U phase, V phase, and W phase of the motor generator 10. The present invention is not limited by this configuration. It is possible to provide two current sensors in two phases of the motor generator 10, and to calculate the current value of the remaining phase on the basis of Kirchhoff's laws. The third, fourth, and fifth embodiments according to the present invention will show later the drive device in the system using two current detection sensors.

(Power Switching Element Sw (Swp, Swn))

The first and second embodiments previously described use IGBT as the power switching element as the target device to be controlled by the drive device, where the IGBT is equipped with the freewheel diode FD and the IGBT and the freewheel diode are formed on the same semiconductor substrate. The present invention is not limited by this configuration. It is possible to use another IGBT, where the freewheel diode and the IGBT are not formed on the same semiconductor substrate. It is possible for the latter configuration to decrease the electric power consumption of the IGBT and the freewheel diode by inhibiting the power switching element Swp as the IGBT from being turned on when a current flows in the freewheel diode FD.

It is also possible to have a modification which uses a power MOS FET (power metal oxide semiconductor field effect transistor) as the power switching element Sw as the target to be controlled instead of IGBT. In this modification, because the on-resistance of the power MOS FET is smaller than that of the freewheel didoe FD, it can be considered to flow a current in the power MOS FET during the period other than a dead time period of the power MOS FET. Because it is better to set the freewheel diode FD into the freewheel mode when a temperature of the power MOS FET is increased, it is possible to apply the concept of the drive device according to the present invention to this modification.

It is possible to apply the concept of the present invention previously described to a system configuration in which power MOS FETs are used as the power switching element Sw (Swp, Swn) and one group of the freewheel diodes FDp in the high voltage side and the freewheel diodes FDn in the low voltage side is eliminated. A current can flow in both directions of such a power MOS FET by switching the input terminal with the output terminal of the power MOS FET. Although it is necessary to use a freewheel diode FD to be arranged in parallel to each of power switching elements Sw (Swp, Swn) when a dead time period can be used on turning on/off the power switching elements Swp in the high voltage side and the power switching elements Swn in the low voltage side, there is a conventional power conversion circuit as an inverter which does not use any dead time period, for example, disclosed in U.S. Pat. No. 7,130,205.

(Inductor)

The present invention does not limit using the inductor mounted on the motor generator 10 shown in FIG. 1, which is connected to the connection node between the power switching element Swp in the high voltage side and the power switching element Swn in the low voltage side in the inverter IV as the electric power conversion circuit IV.

Figure 7:
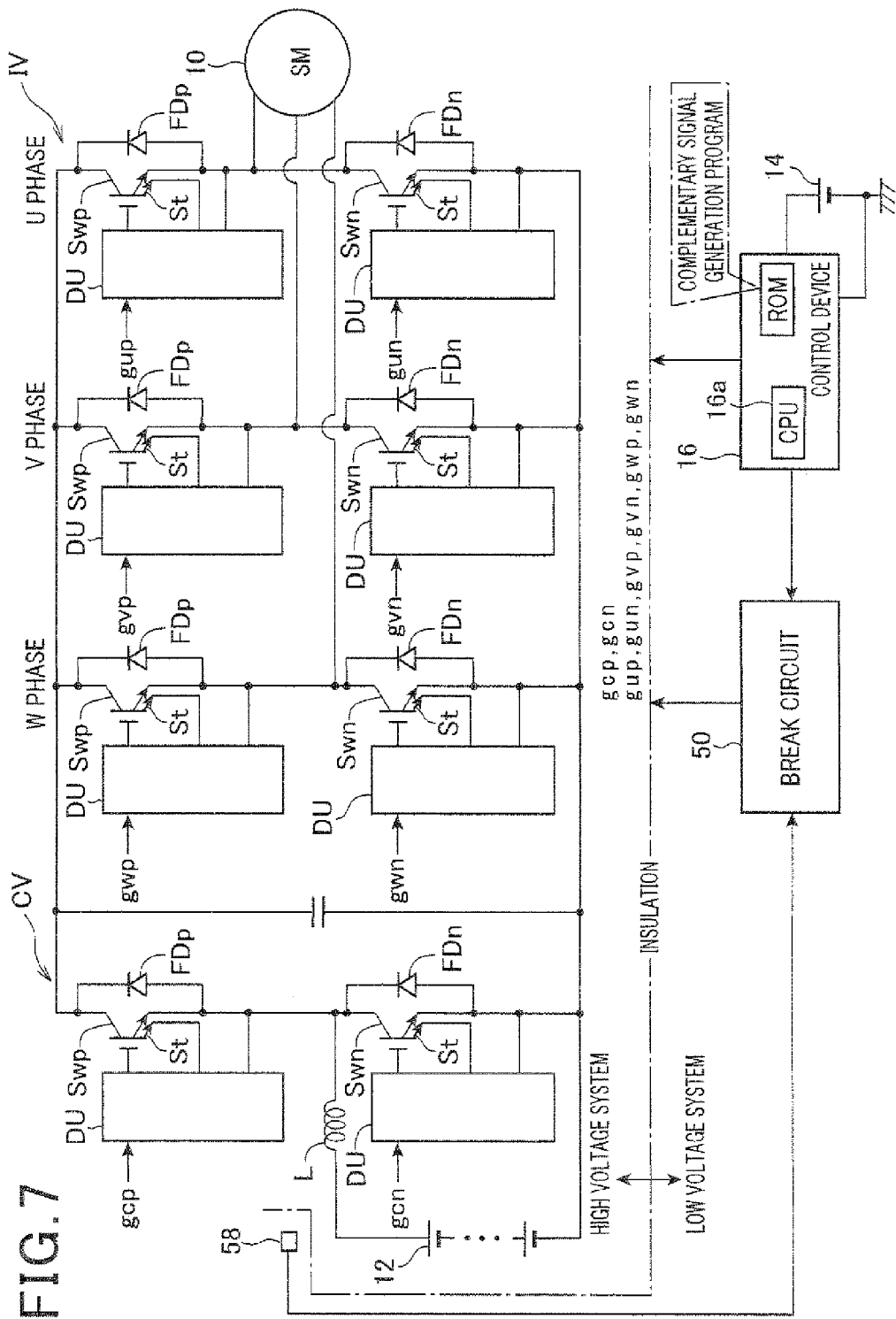
FIG. 7 is a view showing another configuration of the system according to the first and second embodiments of the present invention.

FIG. 7 is a view showing a configuration of a modification of the system according to the first and second embodiments of the present invention.

As shown in FIG. 7, it is possible to use a reactor L mounted to the converter CV instead of the inductor mounted to the motor generator 10. In FIG. 7, the same components of the system according to the first and second embodiments shown in FIG. 1 and FIG. 6 will be designated by the same reference numbers and characters. The explanation of the same components is omitted here.

The converter CV shown in FIG. 7 is equipped with the power switching element Swp in the high voltage side, the power switching element Swn in the low voltage side, and the reactor L. The power switching element Swp in the high voltage side and the power switching element Swn in the low voltage side are connected in series. The reactor L is connected to the connection node between the power switching element Swp in the high voltage side and the power switching element. Swn in the low voltage side. The drive unit DU controls the operation of the power switching element Sw (Swp, Swn) in the converter CV on the basis of the operation signal g (gcp, gcn) transferred from the break circuit 50 and the control device 16.

That is, the control device 16 generates as a complimentary signal the operation signal gcp to control the power switching element Swp in the high voltage side, and the operation signal gcp to control the operation of the power switching element Swn in the low voltage side. The control device 16 outputs the generated operation signals gcp and gcn to the break circuit 50.

When receiving the operation signals gcp and gcn, the break circuit 50 cancels the operation signals gcp and gcn to instruct the power switching element to be turned on according to the current flowing in the reactor L, where the state of the freewheel diode FD built in this power switching element is currently in the freewheel mode, which is one of the power switching element Swp in the high voltage side and the power switching element Swn in the low voltage side. The current sensor 58 shown in FIG. 7 detects the current flowing in the reactor L.

It is possible to obtain the above function provided by the break circuit 50 in the drive device according to the first embodiment by using software programs, as in the case for the second embodiment.

It is possible to obtain the same effect (1) previously described when the break circuit 50 is arranged in the high voltage system side.

The drive devices according to the first embodiment, the second embodiment, and the modification thereof according to the present invention are applied to the systems having the motor generator 10 of a synchronous motor generator. The present invention is not limited by these configurations. For example, it is possible to apply the drive device according to the present invention to a system equipped with one of induction motor generators of two phases and not more than three phases, and synchronous motor of two phases and not more than three phases.

It is also possible to apply the power conversion circuit and the drive device according to the present invention to electric vehicles in addition to the hybrid vehicles.

Third Embodiment

A description will be given of the drive device according to the third embodiment of the present invention with reference to FIG. 8 to FIG. 12.

Figure 8:
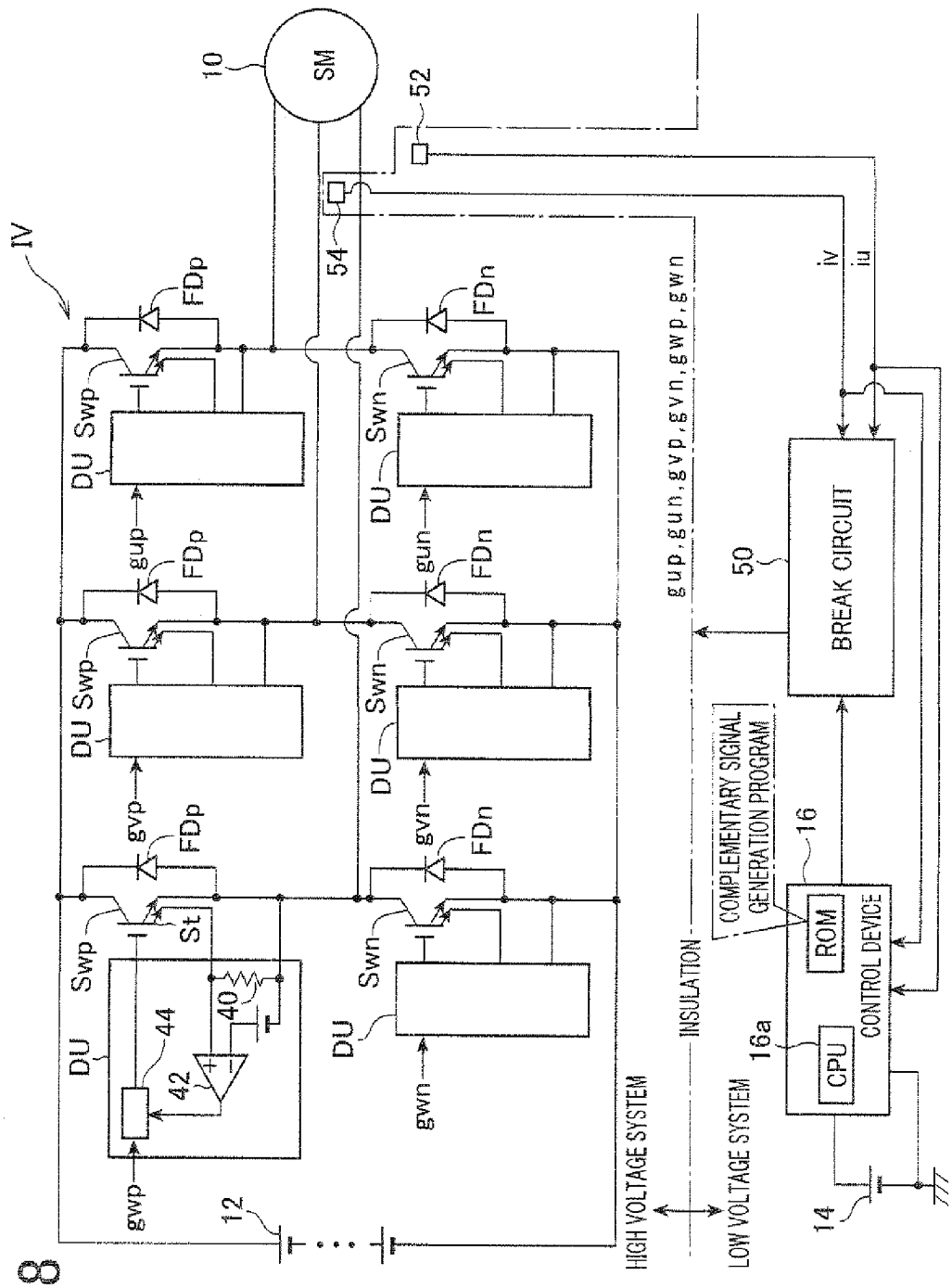
FIG. 8 is a view showing a configuration of a system comprised of a motor generator, an inverter such as an electric power conversion circuit, power switching elements, and a drive device comprised of a control device, a break circuit and drive units DU according to a third embodiment of the present invention.

FIG. 8 is a view showing a configuration of the system comprised of the motor generator 10, the inverter IV as an electric power conversion circuit, and the drive device according to the third embodiment of the present invention.

The drive device according to the third embodiment is comprised mainly of the break circuit 50, the control device 16, and the drive units DU. The inverter IV as an electric power conversion circuit is equipped with power switching elements Sw (Swp, Swn). The power switching elements Sw (Swp, Swn) are controlled in operation by the drive device according to the third embodiment.

As shown in FIG. 8, the motor generator 10 as the on-vehicle main device is electrically connected to the high voltage battery 12 through the inverter IV. The inverter IV is comprised of three pairs of power switching elements Sw (Swp, Swn). That is, the three pairs are connected in parallel in the electric power conversion circuit. Each of the three pairs is comprised of the power switching element Swp in a high voltage side and the power switching element Swn in the low voltage side. In particular, the power switching element Swp in a high voltage side and a power switching element Swn in the low voltage side in each pair are connected in series.

A connection node between the power switching element Swp in the high voltage side and the power switching element Swn in the low voltage side in each pair is electrically connected to a corresponding phase terminal of the motor generator 10.

A freewheel diode FDp is connected in parallel to the power switching element Swp in the high voltage side. A freewheel diode FDn is also connected in parallel to the power switching element Swn in a low voltage side. The input terminal and the output terminal of the power switching element Swp in the high voltage side are connected to the cathode and the anode of the freewheel diode FDp in the high voltage side, respectively. The input terminal and the output terminal of the power switching element Swn in the low voltage side are connected to the cathode and the anode of the freewheel diode FDn in the low voltage side, respectively.

On the other hand, the control device 16 operates under the low voltage battery 14 in the low voltage system, and controls the operation of the inverter IV in order to control various parameters of the motor generator 10 as a control target.

As shown in FIG. 8, the control device 16 generates operation signals gup, gyp, gwp of the power switching elements Swp in U phase, V phase, and W phase of the motor generator 10 on the basis of current values as detection results of current sensors 52 and 54. Further, the control device 16 generates operation signals gun, gvn, gwn of the power switching elements Swn in U phase, V phase, and W phase of the motor generator 10 on the basis of current values as detection results of the current sensors 52 and 54.

The drive units DUs are driven by the control device 16 and the break circuit 50 through the drive units DU. Each of the drive units DU is connected to the conductive control terminal (gate terminal) of the corresponding power switching element Sw (Swp, Swn).

The high voltage system equipped with the inverter IV as an electric power conversion circuit is electrically insulated from the low voltage system equipped with the control device 16 by the insulation means, for example, by a photo coupler. The control device 16 and the break circuit 50 generate these operation signals gup, gyp, gwp, gun, gvn, gwn, etc. The operation signals gup, gvp, gwp, gun, gvn, gwn, etc. are then transferred to the drive units DU in the high voltage system side through the insulation means.

The current sensors 52 and 54 detect the current flowing in each of two phases, for example, U phase and V phase. In addition, the current sensors 52 and 54 also detect the direction of the current.

In the system configuration shown in FIG. 8, the current sensors 52 and 54 are arranged in the low voltage side because these current sensors 52 and 54 are non-contact type sensor and capable of detecting the current flowing through electrical lines between the motor generator 10 and the inverter IV without electrically contacting with the electrical lines, and without through the insulation means.

Each of the power switching elements Sw (Swp, Swn) inhibits the current flowing from the output terminal to the input terminal thereof. Each of the power switching elements Sw (Swp, Swn) is composed of an insulation gate bipolar transistor (IGBT).

Each of the power switching elements Sw (Swp, Swn) has a sense terminal St in order to detect small currents. The small currents indicate a correlation between the current flowing in the input and output terminals of the power switching element Sw (Swp, Swn) and the current and the current flowing in the freewheel diode FD (FDp, FDn).

The configuration of such an IGBT with a built-in freewheel diode can provide the function of the sense terminal St. That is, in the configuration of the drive device according to the third embodiment, the power switching element Swp and the freewheel diode FDp in the high voltage side are formed adjacent to each other on the same semiconductor substrate, and the power switching element Swn and the freewheel diode FDn in the low voltage side are formed adjacent to each other on the same semiconductor substrate.

Figure 9A:
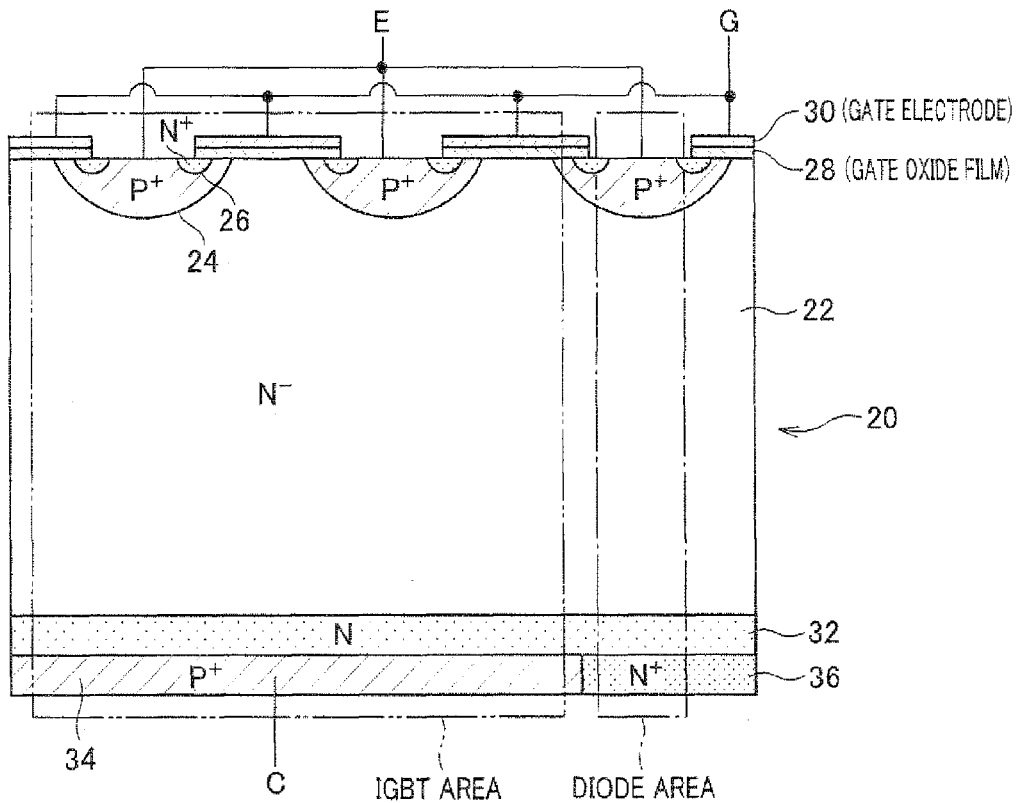
FIG. 9A is a view showing a cross section of the IGBT with the built-in freewheel diode in the electric power conversion circuit controlled by the drive device according to the third embodiment shown in FIG. 8.
Figure 9B:
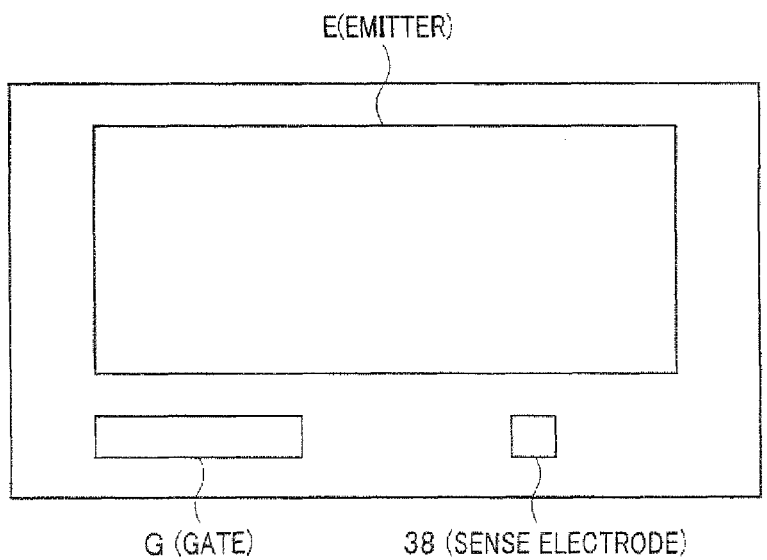
FIG. 9B is a view showing a cross section of the freewheel diode built in the IGBT shown in FIG. 9A.

FIG. 9A is a view showing a cross section of an IGBT (Swp, Swn) with a built-in freewheel diode FD (FDp, FDn) which is controlled by the drive unit DU in the drive device according to the third embodiment shown in FIG. 8. FIG. 9B is a view showing a cross section of the freewheel diode FD (FDp, FDn) built in the IGBT shown in FIG. 9A.

As in the case for the first and second embodiments previously described, in the following explanation, reference character reference "Sw" of the power switching elements represents both the power switching elements Swp and the power switching elements Swn, and reference character "FD" indicates both the built-in freewheel diodes FDp, FDn.

As shown in FIG. 9A and FIG. 9B, the IGBT region and the freewheel diode region are adjacent with each other and formed on the same semiconductor substrate 20. The region extending from the main surface toward the back surface of the semiconductor substrate 20 is a N type region 22 of a N conductivity type.

The P conductive type region (P type region for short) 24 is formed on the surface of the semiconductor substrate 20. The N conductive type region (N type region for short) 26 is formed in the P type region 24. The N type region has a high concentration rather than the concentration of the N type region 22. The P type region 24 and the N type region 26 are connected to the emitter terminal E of the IGBT and the anode terminal of the freewheel diode. The gate electrode 30 is formed on the P type region 24 and the N type region 26 through the gate oxide film 28.

On the other hand, the N type region 36 and the P type region 34 are formed adjacent with each other on the back surface of the semiconductor substrate 20. The N type region 36 has a high concentration rather than that of the N type region 22.

The P type region 34 forms the collector region of the IGBT, the N type region 36 forms the cathode region of the freewheel diode. The N type region 32 is formed between the N type region 22 and the region composed of the P type region 34 and the N type region 36. The N type region 32 has a lower concentration than the concentration of the N type region 22.

FIG. 9B is a plan view showing the main surface of the semiconductor substrate 20. As shown in FIG. 9B, the emitter region E occupies a large part of the main surface of the semiconductor substrate 20. The gate region G and the sense electrode 38 occupy the remaining region of the main surface of the semiconductor substrate 20. An actual area size of the sense electrode 38 is a one several-thousandth of the area of the emitter region E. This makes it possible to output a small current while having a correlation with the current flowing in the IGBT and the freewheel diode.

The drive unit DU has the function to forcedly turn off the power switching element Sw (Swp, Swn) when the detected current flowing between the input terminal (collector terminal) and the output terminal (emitter terminal) of the power switching element Sw is excessively a large value in addition to having the function to turn on and turn off the power switching elements on the basis of the operation signals g (gup, gyp, gwp, gun, gvn, gwn). In more detail, the drive unit DU forcedly turns off the power switching element Sw when the current flowing between the input terminal and the output terminal of the power switching element is not less than a threshold current value Ith on the basis of the small current which is output from the sense terminal St of the power switching element Sw.

As shown in the upper column of FIG. 8, a combination of the resistance 40 and the comparator 42 in the drive unit DU can provide the above function. That is, the comparator 42 compares the voltage drop value in the resistance 40 when a small current from the sense terminal St flows in the resistance 40 with the threshold voltage value Vth corresponding to the threshold current value Ith. The comparison result of the comparator 42 is transferred to the drive circuit 44 which performs the charging/discharging operation of the gate terminal of the power switching element Sw. The drive circuit 44 in the drive unit DU turns off the power switching element Sw when the drive unit DU detects that the current flowing in the power switching element Sw exceeds the threshold current value Ith.

The control device 16 is equipped with a central processing unit (CPU) 16a, and performs an application program to generate the operation signal g, where the operation signal g is a general term for the operation signals gup, gyp, gwp, gun, gvn, gwn, etc.

The control device 16 has heavy load in processing when it generates these operation signals gup, gyp, gwp, gun, gvn, gwn, etc. in addition to performing the detection whether or not the current flowing in the freewheel diode FD is in the freewheel mode when no current flows in the power switching element Sw, but a current flows in the freewheel diode FD, where the power switching element Sw and the freewheel diode FD are connected in parallel with each other. In order to avoid this drawback, the control device 16 generates the operation signal g which serves as a complementary signal g capable of instructing the power switching element Sw in the high voltage side and the power switching element Sw in the low voltage side to be alternately turned on and turned off regardless of the freewheel mode of the freewheel diode FD.

When the IGBT equipped with the built-in freewheel diode is used as the power switching element Sw, the power loss of the power switching element Sw is increased when the power switching element Sw is turned on under the freewheel mode where a current flows in the freewheel diode.

When the freewheel mode is detected, it is necessary for the control device 16 to have the function to cancel the turning-on instruction of the operation signal g.

It is necessary for the drive unit DU to cancel the turning-on instruction of the operation signal g transferred from the control device 16 on the basis of the output of the sense terminal St of the power switching element Sw when the state of the freewheel diode FD is in the freewheel mode. This makes it possible to rapidly execute the operation to turn off the power switching element Sw when the state of the freewheel diode FD is in the freewheel mode. That is, it takes a delay time period until the drive unit DU cancels the turning-on instruction of the operation signal g after the drive unit DU detects the outputs from the current sensors 52 and 54. In general, a small current output from the sense terminal St does not adequately correspond to the current flowing between the input terminal and the output terminal of the power switching element Sw. It is therefore difficult to detect the occurrence of the freewheel mode of the freewheel diode FD immediately after the freewheel diode FD is in the freewheel mode where a less current flows in the freewheel diode.

In the configuration of the drive device according to the third embodiment shown in FIG. 8, the break circuit 50 receives the current values transferred from the current sensors 52 and 54 in two phases, for example, U phase and V phase of the motor generator 10, and adjusts the turning-on instruction of the operation signal g on the basis of the detection results. Specifically, the break circuit 50 inputs the operation signal g generated by and transferred from the control device 16, and adjusts the operation signal g, and outputs the adjusted operation signal g to each of the control units DU.

Figure 10:
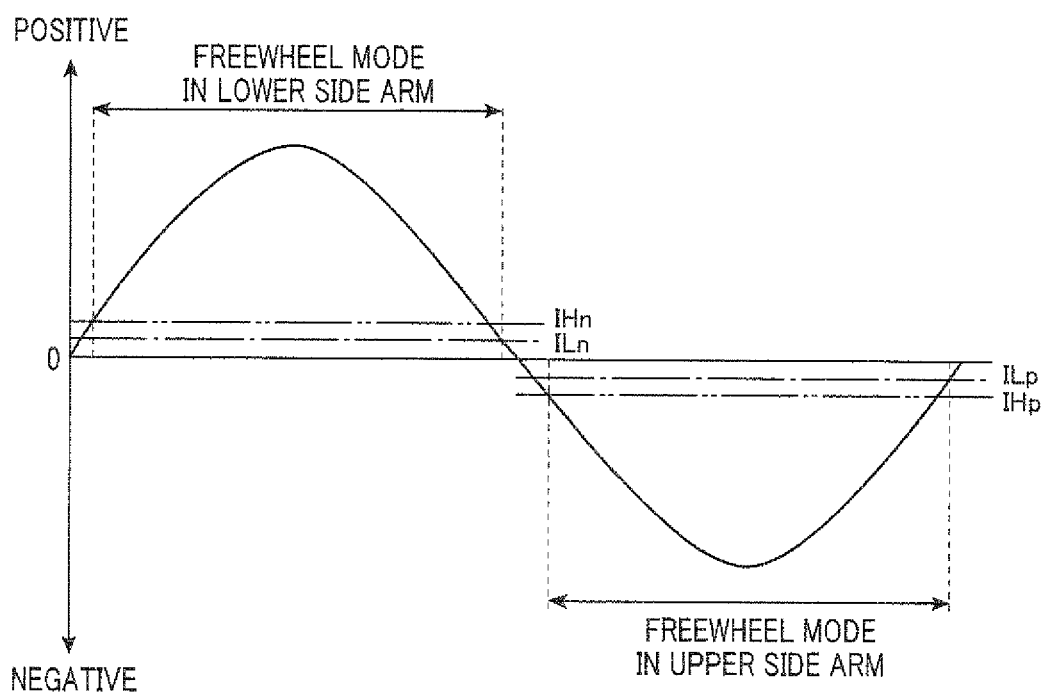
FIG. 10 is a timing chart showing a method of detecting a freewheel mode of the freewheel diode by the break circuit in the drive device according to a third embodiment shown in FIG. 8.

FIG. 10 is a timing chart showing an operation of detecting a freewheel mode performed by the break circuit 50 in the drive device according to the third embodiment shown in FIG. 8. The break circuit 50 performs such a special process. In the timing chart shown in FIG. 10, a positive current flows from the inverter IV to the motor generator 10.

As shown in FIG. 10, when the current in one phase (U phase, V phase, or W phase) flowing in the motor generator 10 is not less than the threshold current value IHn (>0), the break circuit 50 detects the freewheel mode of the freewheel diode in the lower arm in this phase.

Further, when the current in one phase (U phase, V phase, or W phase) flowing in the motor generator 10 is not more than the threshold current value IHp (<0), the break circuit 50 detects the freewheel mode of the freewheel diode in the upper arm in this phase.

Still further, when the current in one phase (U phase, V phase, or W phase) flowing in the motor generator 10 is not more than the threshold current value ILn (>0), the break circuit 50 detects the freewheel mode of the freewheel diode in the lower arm in this phase. When the current in this phase (U phase, V phase, or W phase) flowing in the motor generator 10 is not less than the threshold current value ILp (<0), the break circuit 50 detects the freewheel mode of the freewheel diode in the upper arm in this phase.

In particular, the threshold current values ILn and ILp are determined in consideration of a delay time period counted from the timing when the current state is not the freewheel mode on the basis of the outputs from the current sensors 52 and 54 to the timing when the turning-on instruction of the operation signal g is actually released.

On the other hand, when the threshold current values ILn, ILp become zero, there is a possibility of cancelling the turning-on instruction of the operation signal g in spite of not being in the freewheel mode caused by the delay.

Still further, as previously described, the break circuit 50 uses the different threshold current values IHn and ILn where the threshold current value IHn is used for detecting that the lower arm is shifted to the freewheel mode, and the threshold current value ILn is used for detecting that the lower arm is shifted to a mode other than the freewheel mode.

Furthermore, the break circuit 50 uses the different threshold current values IHp and ILp where the threshold current value IHp is used for detecting that the upper arm is shifted to the freewheel mode, and the threshold current value ILp is used for detecting that the upper arm is shifted to a mode other than the freewheel mode. Using those threshold current values IHn, ILn, IHp, ILp can increase a noise resistance capability. That is, the break circuit 50 frequently detects the freewheel mode and no-freewheel mode because each of the phase currents flowing in the motor generator 10 is a very small current, and noises affect the detection operation of the break circuit 50. This turns on and turns off the power switching element Sw with a high frequency, and generates heat energy in the power switching element Sw, and the temperature of the power switching, element equipped with the built-in freewheel diode FD is increased.

Figure 11:
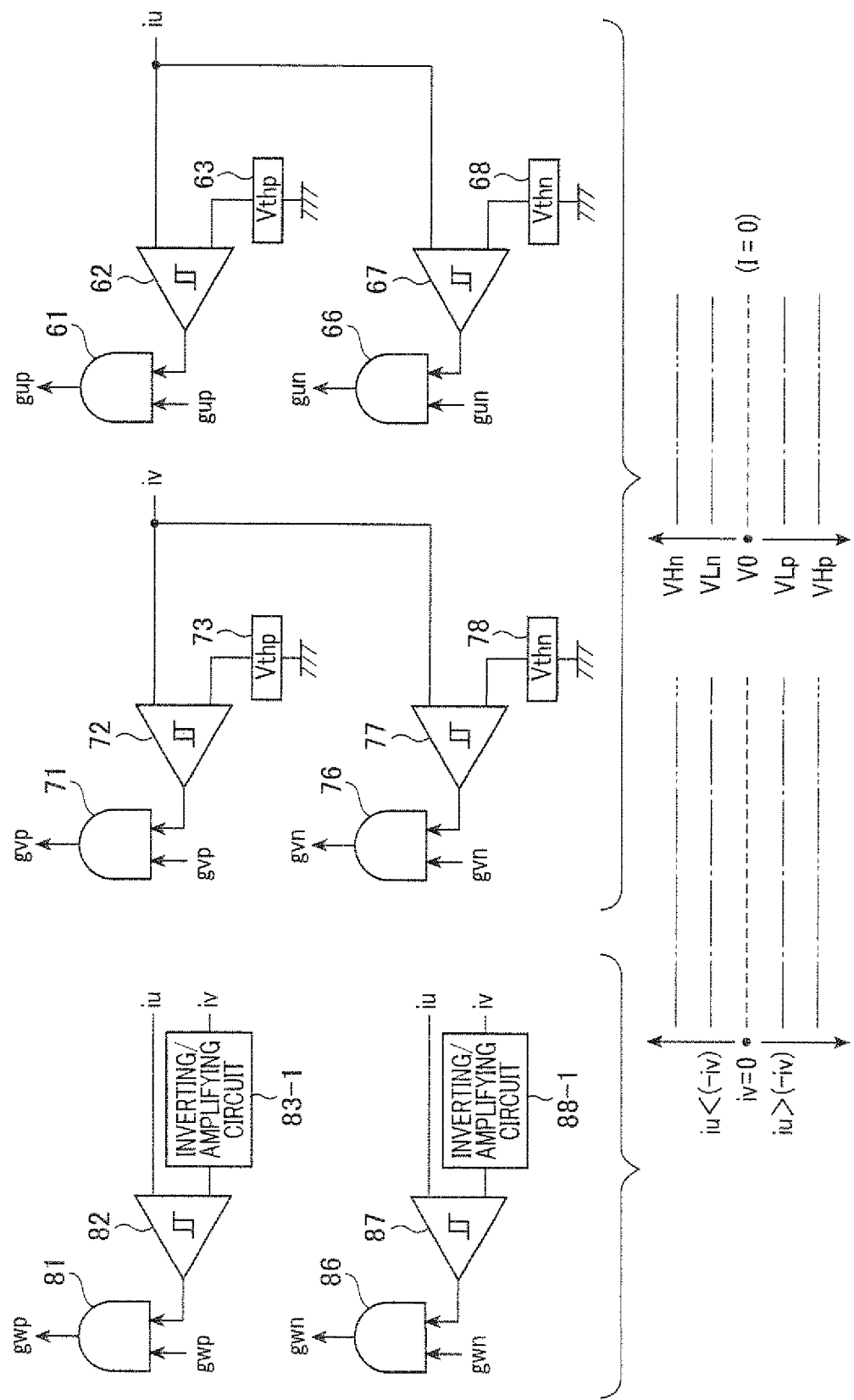
FIG. 11 is a view showing a break circuit according to the third embodiment in the system shown in FIG. 8.

FIG. 11 shows a configuration of the break circuit 50 in the drive device according to the third embodiment.

A description will now be given of the break circuit 50 performing following operations (a) and (b):

(a) to adjust the operation signals gup and gun in U phase on the basis of the detection results transferred from the current sensor 52 which detects the current value flowing in U phase of the motor generator 10; and (b) to adjust the operation signals gyp and gvn in V phase on the basis of the detection results transferred from the current sensor 54 which detects the current value flowing in V phase of the motor generator 10.

As shown in FIG. 11, a hysteresis comparator 62 inputs the current value iu (actually, a voltage signal) in U phase detected by the current sensor 52 and a reference voltage value Vthp of a reference power source 63. An AND circuit 61 inputs the output signal transferred from the hysteresis comparator 62 and the operation signal gup transferred from the control device 16. The AND circuit 61 performs a logical product between them and outputs a logical product signal as the operation signal gup in order to control the operation of the upper arm in U phase.

The hysteresis comparator 62 generates the threshold value VHp and VLp shown at the bottom row in FIG. 11. The threshold value VHp corresponds to the threshold current value IHp, and the threshold value VLp corresponds o the threshold current value ILp shown in FIG. 10.

As in the case for the hysteresis comparator 62 described above, a hysteresis comparator 67 inputs the current value iu (in actual case, corresponding to a voltage signal) in U phase detected by the current sensor 52 and a reference voltage Vthn of a reference power source 68. An AND circuit 66 inputs the output signal transferred from the hysteresis comparator 67 and the operation signal gun of the lower arm in U phase transferred from the control device 16. The AND circuit 66 performs a logical product between them and outputs a logical product signal as the operation signal gun in order to control the operation of the lower arm in U phase.

The hysteresis comparator 67 generates the threshold value VHn and VLn shown at the bottom row in FIG. 11. The threshold value VHn corresponds to the threshold current value IHn, and the threshold value VLn corresponds to the threshold current value ILn shown in FIG. 10.

As in the case for the hysteresis comparator 62, a hysteresis comparator 72 inputs the current value iv (actually, a voltage signal) in V phase detected by the current sensor 54 and a reference voltage Vthp of a reference power source 73. An AND circuit 71 inputs the output signal transferred from the hysteresis comparator 72 and the operation signal gyp transferred from the control device 16. The AND circuit 71 performs a logical product between them and outputs a logical product signal as the operation signal gyp in order to control the operation of the upper arm in V phase.

Similarly, a hysteresis comparator 77 inputs the current value iv in V phase detected by the current sensor 54 and a reference voltage Vthn of a reference power source 78. An AND circuit 76 inputs the output signal transferred from the hysteresis comparator 77 and the operation signal gvn of the lower arm in V phase transferred from the control device 16. The AND circuit 76 performs a logical product between them and outputs a logical product signal as the operation signal gvn in order to control the operation of the lower arm in V phase.

Next, a description will now be given of the process for adjusting the operation signals gwp and gwn in W phase where a W phase current is not directly detected by any current sensor.

Because the configuration of the drive device according to the third embodiment has no current sensor which detects any W phase current flowing in an electrical path in W phase of the motor generator 10, the break circuit 50 in the drive device detects a sign of the W phase current by comparing the current value iu detected by the current sensor 52 with the inverted value of the current value iv detected by the current sensor 54, and finally detects the occurrence of the freewheel diode on the basis of the sign of the W phase current obtained by the comparison result.

That is, according to Kirchhoff's laws, it is possible to obtain the following equation because iu+iv+iw=zero:

$$iw=-(iu+iv)=\{iu-(-iv)\}.$$

Figure 12:
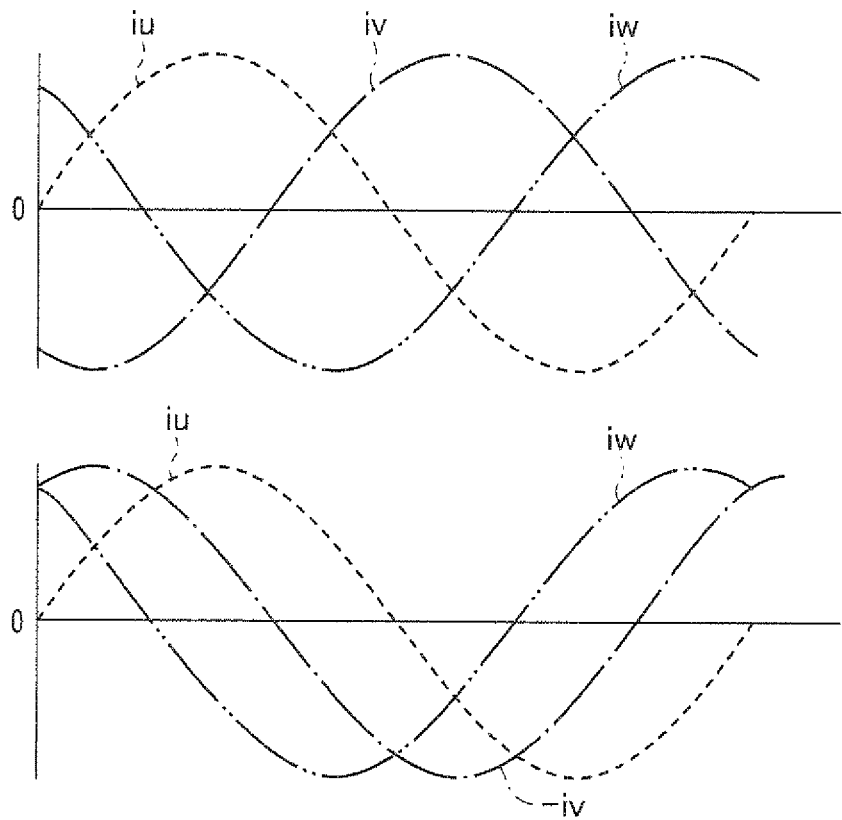
FIG. 12 is timing charts showing a method of detecting the freewheel mode of the freewheel diode in W phase by the drive device according to the third embodiment shown in FIG. 8.

That is, the sign of the W phase current value is inverted at the timing when the difference between the U phase current value iu and the −iv (inverted sign of the V phase current value) is switched. FIG. 12 shows such a relationship.

As shown in FIG. 11, the hysteresis comparator 82 inputs the current value iu of U phase detected by the current sensor 52 and an offset value which is inverted by the inverting and amplifying circuit 83-1. This inverting and amplifying circuit 83-1 inverts and amplifies the current value iv of V phase detected by the current sensor 54. This inverting and amplifying circuit 83-1 converts the increase of the current value iv to the decrease, and the decrease of the current value iv to the increase, and add an offset value to the converted value.

On the other hand, the hysteresis comparator 82 outputs a logical high (H) value when the received current value iu of U phase becomes larger than the inverted value −iv by a predetermined value (corresponding to VHp), where the inverted value −iv is obtained by reversing the current value iv of V phase. After this, the hysteresis comparator 82 outputs a logical low (L) value when the current value iu of U phase becomes not more than the value which is obtained by adding the predetermined value (corresponding to the value −VLp) to the inverted value −iv.

The reason why the inverting and amplifying circuit 83-1 outputs the offset value of the inverted current value iv of V phase is to increase each of the pair of the threshold values of the hysteresis comparator 82 rather than the current value iv of V phase. The AND circuit 81 performs a logical product between the output signal of the hysteresis comparator 82 and the operation signal gwp, and outputs its logical product as the operation signal gwp which is directly transferred as the final instruction signal gwp to the corresponding drive unit DU.

The hysteresis comparator 87 inputs the current value iu of U phase detected by the current sensor 52 and an offset value which is inverted by the inverting and amplifying circuit 88-1. The inverting and amplifying circuit 88-1 inverts and amplifies the current value iv of V phase detected by the current sensor 54. This inverting and amplifying circuit 88-1 converts the increase of the current value iv to the decrease, and the decrease of the current value iv to the increase, and add an offset value to the converted value.

On the other hand, the hysteresis comparator 87 outputs a logical high (H) value when the received current value iu of U phase becomes larger than the inverted current value −iv by a predetermined value (corresponding to VHn), where the inverted current value −iv is obtained by reversing the current value iv in V phase. After this, the hysteresis comparator 87 outputs a logical low (L) value when the current value iu of U phase becomes not more than the value which is obtained by adding the predetermined value (corresponding to the value −VLn) to the inverted value −iv.

The reason why the inverting and amplifying circuit 83-1 outputs the offset value of the inverted current value iv of V phase is to increase each of the pair of the threshold values of the hysteresis comparator 82 rather than the current value iv of V phase. The AND circuit 81 performs a logical product between the output signal of the hysteresis comparator 82 and the operation signal gwn, and outputs its logical product as the operation signal gwn which is directly transferred as the final instruction signal gwn to the corresponding drive unit DU.

The drive device according to the third embodiment of the present invention provides the following effects (6) to (10).

(6) The break circuit 50 in the drive device according to the third embodiment detects the freewheel mode of the freewheel diode in W phase by comparing the current value iu of U phase detected by the current sensor 52 and the inverted current value −iv obtained by inverting the current value iv of V phase detected by the current sensor 54. It is thereby possible to effectively detect the freewheel mode of the freewheel diode in W phase without using any current sensor to detect the current value in W phase of the motor generator 10.

(7) In the configuration of the power switching elements Sw (Swp, Swn) to be controlled by the drive device according to the third embodiment, the power switching element Swp with the built-in freewheel diode FDp in the high voltage side and the power switching elements Swn with the built-in freewheel diode FDn in the low voltage side are arranged adjacent to each other on the same semiconductor substrate. This makes it possible to increase a conductive power loss when the power switching element Sw is turned on during the freewheel mode of the freewheel diode. Accordingly, the break circuit 50 in the drive device can easily detect the occurrence of the freewheel mode and to easily detect the timing to cancel the turning-on instruction of the operation signal g which instructs the power switching element Sw to be turned on.

(8) The threshold current value is shifted from zero toward the forward current side flowing in the freewheel diode FD in order to detect whether or not the freewheel diode FD is in the freewheel mode. This makes it possible to avoid any delay counted from the timing at which the freewheel mode is shifted to non-freewheel mode by releasing the operation to cancel the turning-on instruction of the operation signal g.

(9) The break circuit 50 in the drive device according to the third embodiment uses the different threshold values such as threshold values IHp, IHn and the threshold values ILp and ILn, where the operation mode of the freewheel diode FD is shifted from the freewheel mode to the non-freewheel mode is detected by using the threshold value IHp and IHn, and the operation mode of the freewheel diode FD is shifted from non-freewheel mode to the freewheel mode is detected by using the threshold value ILp and ILn. This makes it possible to effectively avoid the high-frequency repetition of cancelling the turning-on instruction of the operation signal g and releasing this cancelling operation.

(10) The break circuit 50 cancels the turning-on instruction of the operation signal g as a complementary signal generated by performing an application program in the control device 16, and transferred from the control device 16. This makes it possible to timely and effectively perform the canceling operation to cancel the turning-on instruction of the operation signal g without increasing the operation load of the control device 16.

Fourth Embodiment

A description will be given of the drive device according to the fourth embodiment of the present invention with reference to FIG. 13.

The difference between the fourth embodiment and the third embodiment will be explained below in detail. The explanation for the same components between the fourth embodiment and the third embodiment is omitted here.

The fourth embodiment uses the current sensors 52' and 54' having different directions in forward current which are reversed with each other. On the other hand, the embodiments previously described uses the current sensors having the same direction in forward current. The current sensors 52' and 54' used in the fourth embodiment has the configuration shown in FIG. 13. That is, as shown in FIG. 13, the current sensor 52' is equipped with the core 52a and a hole element 52b. The hole element 52b is placed in a gap of the core 52a. Similarly, the current sensor 54' is equipped with the core 54a and a hole element 54b. The hole element 54b is placed in a gap of the core 54a. The hole elements 52b and 54b detect magnetic field generated by the current flowing in the axis direction of the core 52a and 54a. When the current flows from the inverter IV to the motor generator 10, the current sensors 52' and 54' are arranged so that the direction of the magnetic field detected by the hole element 52b is reversed to the direction of the magnetic field detected by the hole element 54b. This makes the inverted current value output from the current sensor 54' becomes inverted current value which is shown in the third embodiment.

The configuration of the break circuit 50 in the fourth embodiment does not have the inverter to invert the current value detected by and transferred from the detection sensor 54'. However, an offset value is added to the current value transferred from the current sensor 54'.

The break circuit 50 in the fourth embodiment further has the following effect (12) in addition to the effects (6) to (11) obtained by the third embodiment.

(12) In the fourth embodiment, the break circuit 50 uses the current detected by the current sensor 52' and the current detected by the current sensor 54' which are reversed with each other in current flowing direction. This makes it possible for the break circuit 50 to compare the current value iu of U phase with the inverted current value −iv obtained by inverting the current value iv of V phase detected by the current sensor 54' without using any device to perform the process to invert the current value detected by the current sensor 54'.

Fifth Embodiment

A description will be given of the drive device according to the fifth embodiment of the present invention with reference to FIG. 14.

Figure 14:
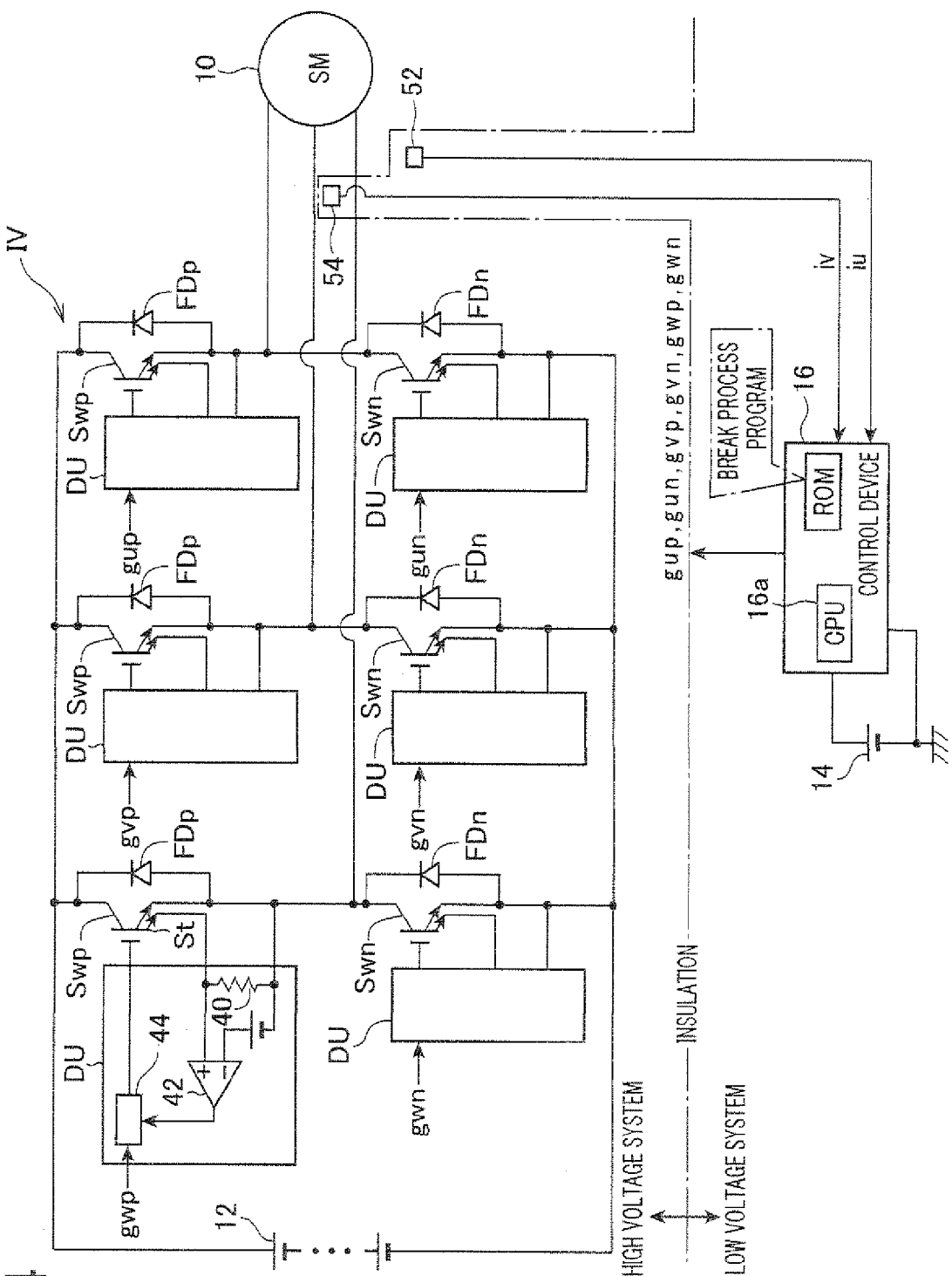
FIG. 14 is a view showing a configuration of a system comprised of a motor generator, an inverter IV as an electric power conversion circuit, drive units DU, and a drive device according to a fifth embodiment of the present invention.

FIG. 14 is a view showing a configuration of the system comprised of the motor generator 10, the inverter IV composed mainly of the power switching elements Sw (Swp, Swn), and the drive device according to the fifth embodiment of the present invention. The drive device is composed mainly of the control device 16, and the drive units DU.

The difference between the fifth embodiment and the third embodiment will be explained below in detail. The explanation for the same components between the fifth embodiment and the third embodiment is omitted here.

That is, as shown in FIG. 14, the drive device according to the fifth embodiment is composed mainly of the control device 16 and the drive units DU without the break circuit 50 shown in FIG. 8.

The control device 16 executes application programs with which the functions of the break circuit 50 are realized. The functions of the beak circuit 50 are previously described in detail in the third embodiment, and the explanation of these functions of the break circuit 50 is omitted here.

It is therefore possible for the derive device according to the fifth embodiment to have the same effects of the break circuit 50 in the drive device according to the third embodiment.

Other Modifications (Means for Detecting the Freewheel Mode of Freewheel Diode)

In the third embodiment, the inverting and amplifying circuit 83 and the inverting and amplifying circuit 88 invert the current value iv of V phase detected by the current sensor 54 and add an offset value to the inverted current value. The present invention is not limited by this. For example, it is possible for one of the hysteresis comparator 82 in a high voltage side and the hysteresis comparator 87 in a low voltage side to use an offset value by adjusting the output of the current sensors 52 and the 54. This method can be applied to the drive device according to the fourth embodiment previously described.

The break circuit 50 and the control device 16 according to the third embodiment previously described generate the different threshold current values in order to detect whether or not the freewheel diode FDp in the high voltage side is in the freewheel mode or the freewheel diode FDn in the low voltage side is in the freewheel mode by setting the hysteresis comparators 62, 67, 72, 77, 82, and 87. The present invention is not limited by this configuration. For example, it is possible to detect the freewheel mode of the freewheel diode by comparing a current value with the threshold value. This can be achieved by adjusting the current value itself or adjusting the output of the current sensor which detects the current.

The break circuit 50 and the control device 16 according to the third embodiment previously described use the different threshold current values in order to detect the two cases when the freewheel diode FD is shifted from the non-freewheel mode to the freewheel mode and the freewheel diode FD is shifted from the freewheel mode to the non-freewheel mode. The present invention is not limited by this configuration. It is possible for the drive device according to the third embodiment of the present invention to obtain the above effect (6) without using the different threshold current values.

The break circuit 50 and the control device 16 according to the third embodiment previously described use the different threshold current values in order to detect whether or not the freewheel diode FDp in the high voltage side is in the freewheel mode or the freewheel diode FDn in the low voltage side is in the freewheel mode. The present invention is not limited by this configuration. It is possible for the drive device according to the third embodiment of the present invention to obtain the above effect (6) without using the different threshold current values.

(Power Switching Element Sw)

The first to fifth embodiments previously described use IGBT as the power switching element as the target device to be controlled by the drive device, where the IGBT is equipped with the built-in freewheel diode FD and the IGBT and the freewheel diode are formed on the same semiconductor substrate. The present invention is not limited by this configuration. It is possible to use another IGBT, where the freewheel diode and the IGBT are not formed on the same semiconductor substrate. It is possible for the latter configuration to decrease the electric power consumption of the IGBT and the freewheel diode by inhibiting the power switching element Swp as the IGBT from being turned on when a current flows in the freewheel diode FD.

It is also possible to have a modification which uses a power MOS (metal oxide semiconductor) field effect transistor as the power switching element Sw as the target to be controlled instead of IGBT. In this modification, because the on-resistance of the power MOS FET is smaller than that of the freewheel diode FD, it can be considered to flow a current in the power MOS FET during the period other than a dead time period of the power MOS FET. Because it is better to set the freewheel diode FD into the freewheel mode when a temperature of the power MOS FET is increased, it is possible to apply the concept of the drive device according to the present invention to this modification.

It is possible to apply the concept of the present invention previously described to a system configuration in which power MOS FETs are used as the power switching element Sw and one group of the freewheel diodes FDp in the high voltage side and the freewheel diodes FDn in the low voltage side is eliminated. A current can flow in both directions such a power MOS FET by switching the input terminal with the output terminal of the power MOS FET. Although it is necessary to use a freewheel diode FD to be arranged in parallel to each of power switching elements Sw (Swp, Swn) when a dead time period can be used on turning on/off the power switching elements Swp in the high voltage side and the power switching elements Swn in the low voltage side, there is a conventional power conversion circuit as an inverter which does not use any dead time period, for example, disclosed in U.S. Pat. No. 7,130,205.

Figure 13:
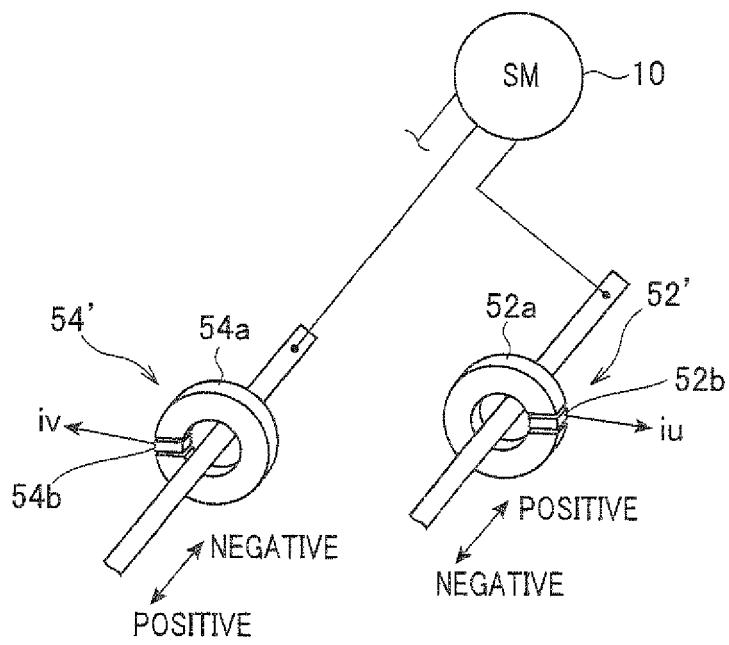
FIG. 13 is a view showing an arrangement of the current sensors in the system according to a fourth embodiment of the present invention.

In the fourth embodiment uses the current sensors 52' and 54' having the configuration shown in FIG. 13. The present invention is not limited by this configuration. For example, it is possible to use an MRE (Magneto Resistance Element) sensor, etc. instead of the current sensor 52' and 54'.

It is possible to obtain the effect (6) provided by the break circuit 50 in the third embodiment previously described when the break circuit 50 is arranged in the high voltage system side.

The drive devices according to the third to fifth embodiments according to the present invention are applied to the systems having the motor generator 10 of a synchronous motor generator. The present invention is not limited by these configurations. For example, it is possible to apply the drive device according to the present invention to a system equipped with one of induction motor generators of two phases and not more than three phases, and synchronous motor of two phases and not more than three phases.

It is also possible to apply the power conversion circuit and the drive device according to the present invention to electric vehicles in addition to the hybrid vehicles.

While specific embodiments of the present invention have been described in detail, it will be appreciated by those skilled in the art that various modifications and alternatives to those details could be developed in light of the overall teachings of the disclosure. Accordingly, the particular arrangements disclosed are meant to be illustrative only and not limited to the scope of the present invention which is to be given the full breadth of the following claims and all equivalents thereof.

What is claimed is:

1. A drive device for controlling an operation of an electric power conversion circuit equipped with a plurality of pairs of switching elements, each of the pairs being comprised of a switching element in a high voltage side and a switching element in a low voltage side connected in series, at least one of the switching elements in the pair being equipped with a freewheel diode, the switching element and the freewheel diode being connected in parallel with each other, and a connection node between the switching element in a high voltage side and the switching element in a low voltage side in each pair being connected to an inductor, the drive device comprising a freewheel mode detection means and an inhibition means, wherein the freewheel mode detection means receives a detection signal regarding current information transferred from a current detection means which detects a current flowing in an electric path at a position of the inductor apart from the connection node between the switching element in a high voltage side and the switching element in a low voltage side in each pair, detects whether or not the state of the freewheel diode arranged in parallel to the switching element is in the freewheel mode on the basis of a comparison result between the received detection signal regarding the current information transferred from the current detection means and a threshold current value, wherein the threshold current value is shifted from zero toward a value at which a forward current flows in the freewheel diode, and the inhibition means inhibits the turning-on operation of the switching element equipped with the freewheel diode when the detection result of the freewheel mode detection means indicates that the state of the freewheel diode is in the freewheel mode in which a current flows in the freewheel diode.

2. The drive device according to claim 1, wherein at least one of the switching element in a high voltage side and the switching element in a low voltage side in each pair and the freewheel diode connected in parallel to the switching element is formed on the same semiconductor substrate.

3. The drive device according to claim 1, wherein the freewheel mode detection means uses a first threshold value and a second threshold value which are different with each other, wherein the first threshold value is used when the state of the freewheel diode is switched from non-freewheel mode to the freewheel mode, and the second threshold value is used when the state of the freewheel diode is switched from the freewheel mode to the non-freewheel mode.

4. The drive device according to claim 1, wherein the inductor is mounted to an electric rotary machine, and the drive device further comprises means for executing software programs capable of generating the operation signals to control the operation of the switching element in a high voltage side and the switching element in a low voltage side in order to adjust control values of the electric rotary machine, and the freewheel mode detection means and the inhibition means are realized by executing the software programs.

5. The drive device according to claim 1, wherein the inductor is mounted on an electric rotary machine as an on-vehicle main device, the freewheel mode detection means and the inhibition means form a low voltage system which is electrically insulated from a high voltage system equipped with the electric power conversion circuit and the electric rotary machine.

6. A drive device for controlling an operation of an electric power conversion circuit equipped with a plurality of pairs of switching elements, each of the pairs being comprised of a switching element in a high voltage side and a switching element in a low voltage side connected in series, at least one of the switching elements in the pair being equipped with a freewheel diode, the switching element and the freewheel diode being connected in parallel with each other, and a connection node between the switching element in a high voltage side and the switching element in a low voltage side in each pair being connected to an inductor, the drive device comprising:

freewheel mode detection means that detects whether or not the state of the freewheel diode is in a freewheel mode in which a current flows in the freewheel diode; and inhibition means that receives a signal regarding current information transferred from a current detection means to detect a current flowing in an electric path at the inductor side rather than the connection node between the switching element in a high voltage side and the switching element in a low voltage side in each pair, detects whether or not the state of the freewheel diode is in the freewheel mode on the basis of the received signal regarding the current information, and inhibits the turning-on operation of the switching element equipped with the freewheel diode when the detection result indicates that the state of the freewheel diode is in the freewheel mode where a current flows in the freewheel diode;

wherein the drive device receives an operation signal which controls the operation of the switching element in a high voltage side and an operation signal which controls the operation of the switching element in a low voltage side, and the drive device controls the operation of these switching elements on the basis of the received operation signals, wherein these operation signals are complementary signals capable of alternately turning on and turning off the switching element in a high voltage side and the switching element in a low voltage side, and the inhibition means receives the operation signal to control the switching element in a high voltage side and the operation signal to control the switching element in a low voltage side, and switches the received operation signal to the operation signal which instructs the switching element to be turned off when the received operation signal instructs the switching element to be turned on according to the detection result by the freewheel mode detection means.

7. The drive device according to claim 6, wherein at least one of the switching element in a high voltage side and the switching element in a low voltage side in each pair and the freewheel diode connected in parallel to the switching element is formed on the same semiconductor substrate.

8. The drive device according to claim 6, wherein the freewheel mode detection means detects whether or not the state of the freewheel diode is in the freewheel mode on the basis of a comparison result between the current information transferred from the current detection means and a threshold current value, and the threshold current value is shifted from zero toward a value by which a forward current can flow in the freewheel diode as the target to detect the occurrence of the freewheel mode.

9. The drive device according to claim 8, wherein the freewheel mode detection means uses a first threshold value and a second threshold value which are different with each other, wherein the first threshold value is used when the state of the freewheel diode is switched from non-freewheel mode to the freewheel mode, and the second threshold value is used when the state of the freewheel diode is switched from the freewheel mode to the non-freewheel mode.

10. A drive device for controlling an operation of an electric power conversion circuit equipped with a plurality of pairs of switching elements, each of the pairs being comprised of a switching element in a high voltage side and a switching element in a low voltage side connected in series, a positive electrode of a direct current power source being connected to each phase of a three-phase electric rotary machine through the switching element in a high voltage side, and a negative electrode of the direct current power source being connected to each phase of the three-phase electric rotary machine through the switching element in a low voltage side, at least of one of the switching elements in the pair being equipped with a freewheel diode, the switching element and the freewheel diode being connected in parallel with each other, and a connection node between the switching element in a high voltage side and the switching element in a low voltage side in each pair being connected to an inductor, the drive device comprising:

freewheel mode detection means that detects whether or not the freewheel diode is in a freewheel mode in which a current flows in the freewheel diode on the basis of a detection result of a first current detection means which detects a current flowing in a first phase of the electric rotary machine and a detection result of a second current detection means which detects a current flowing in the second phase of the electric rotary machine; and inhibition means that inhibits the turning-on operation of the switching element connected in parallel to the freewheel diode which is in the freewheel mode, the inhibition means comprising:

a first phase detection means for detecting whether or not the state of the freewheel diode in a first phase is in the freewheel mode on the basis of a current value flowing in the first phase of the electric rotary machine detected by the first current detection means;

a second phase detection means for detecting whether or not the state of the freewheel diode in a second phase is in the freewheel mode on the basis of a current value flowing in the second phase of the electric rotary machine detected by the second current detection means; and a third phase detection means for detecting whether or not the state of the freewheel diode in a third phase is in the freewheel mode on the basis of a comparison result between the current value flowing in the first phase of the electric rotary machine detected by the first current detection means and an inverted value of the current value flowing in the second phase of the electric rotary machine detected by the second current detection means.

11. The drive device according to claim 10, wherein at least one of the switching element in a high voltage side and the switching element in a low voltage side in each pair and the freewheel diode connected in parallel to this switching element is formed on the same semiconductor substrate.

12. The drive device according to claim 10, wherein the third phase detection means adjusts at least one of the current value of one phase and the inverted current value of other phase, and compares these current values in order to add an offset value to a boundary voltage, at which the freewheel mode of the freewheel diode is detected, toward a voltage side at which a forward current flows in the freewheel diode.

13. The drive device according to claim 12, wherein the third phase detection means uses different offset values in following two cases (I) and (II):
 (I) when the state of the freewheel diode is switched from non-freewheel mode to the freewheel mode; and
 (II) when the state of the freewheel diode is switched from the freewheel mode to the non-freewheel mode.

14. The drive device according to claim 10, wherein the first current detection means detects as a positive current a current flowing from one of the electric power conversion circuit and the three phase electric rotary machine to the other, and the second current detection means detects as a positive current an inverted current of the above positive current.

15. The drive device according to claim 10, wherein the drive device receives an operation signal which controls the operation of the switching element in a high voltage side, and receives an operation signal which controls the operation of the switching element in a low voltage side, and the drive device controls the operation of these switching elements on the basis of the operation signals, and these operation signals are complementary signals capable of alternately turning on and turning off the switching element in a high voltage side and the switching element in a low voltage side, and the inhibition means receives the operation signal which controls the operation of the switching element in a high voltage side and the operation signal which controls the operation of the switching element in a low voltage side, and switches the received operation signal to the operation signal which instructs the switching element to be turned off when the received operation signal instructs the switching element to be turned on according to the detection result by the freewheel mode detection means.

16. The drive device according to claim 10, wherein the drive device further comprises means for executing software programs capable of generating the operation signals to control the operation of the switching element in a high voltage side and the switching element in a low voltage side in order to adjust control values of the three phase electric rotary machine, and the freewheel mode detection means and the inhibition means are realized by executing the software programs.

17. The drive device according to claim 10, wherein the three phase electric rotary machine is an on-vehicle main device, and the freewheel mode detection means and the inhibition means form a low voltage system which is electrically insulated from a high voltage system which is equipped with the electric power conversion circuit and the electric rotary machine.

\* \* \* \* \*